US010190043B2

(12) United States Patent
Pan et al.

(10) Patent No.: US 10,190,043 B2
(45) Date of Patent: Jan. 29, 2019

(54) COMPOSITIONS COMPRISING QUANTUM DOTS

(75) Inventors: Junyou Pan, Frankfurt am Main (DE); Niels Schulte, Kelkheim (DE); Thomas Eberle, Landau (DE); Volker Hilarius, Gross-Umstadt (DE)

(73) Assignee: Merck Patent GmbH, Darmstadt (DE)

( * ) Notice: Subject to any disclaimer, the term of this patent is extended or adjusted under 35 U.S.C. 154(b) by 608 days.

(21) Appl. No.: 13/699,846

(22) PCT Filed: Apr. 28, 2011

(86) PCT No.: PCT/EP2011/002127
§ 371 (c)(1),
(2), (4) Date: Nov. 26, 2012

(87) PCT Pub. No.: WO2011/147522
PCT Pub. Date: Dec. 1, 2011

(65) Prior Publication Data

US 2013/0063023 A1 Mar. 14, 2013

(30) Foreign Application Priority Data

May 27, 2010 (EP) .................................... 10005488

(51) Int. Cl.

| | |
|---|---|
| ***H01L 51/50*** | (2006.01) |
| ***C09K 11/06*** | (2006.01) |
| ***C09K 11/56*** | (2006.01) |
| ***C09K 11/62*** | (2006.01) |
| ***C09K 11/64*** | (2006.01) |
| ***C09K 11/66*** | (2006.01) |
| ***C09K 11/88*** | (2006.01) |
| *C08L 25/18* | (2006.01) |
| *C08L 65/00* | (2006.01) |
| *C08K 5/00* | (2006.01) |

(52) U.S. Cl.
CPC .............. *C09K 11/06* (2013.01); *C09K 11/56* (2013.01); *C09K 11/62* (2013.01); *C09K 11/64* (2013.01); *C09K 11/66* (2013.01); *C09K 11/88* (2013.01); *H01L 51/502* (2013.01); *C08G 2261/3142* (2013.01); *C08G 2261/3162* (2013.01); *C08G 2261/344* (2013.01); *C08G 2261/411* (2013.01); *C08G 2261/5222* (2013.01); *C08G 2261/5242* (2013.01); *C08G 2261/95* (2013.01); *C08K 5/0008* (2013.01); *C08L 25/18* (2013.01); *C08L 65/00* (2013.01); *C09K 2211/10* (2013.01); *C09K 2211/14* (2013.01); *C09K 2211/18* (2013.01); *H01L 51/5016* (2013.01); *H01L 51/5036* (2013.01)

(58) Field of Classification Search
CPC ............... H01L 51/502; H01L 51/5012; H01L 51/5016; H01L 51/0084; H01L 51/0085; H01L 51/0086; H01L 51/0087; H01L 51/0088; H01L 51/0058; H01L 51/5036; C09K 11/06; C09K 2211/10; C09K 2211/14; C09K 2211/1416; C09K 2211/18; C09K 11/56; C09K 11/62; C09K 11/64; C09K 11/66; C09K 11/88; C08L 25/18; C08L 65/00; C08K 5/0008; C08G 2261/3142; C08G 2261/3162; C08G 2261/344; C08G 2261/411; C08G 2261/5222; C08G 2261/5242; C08G 2261/95
USPC ................ 428/690, 917; 313/504, 505, 506; 252/301.16
See application file for complete search history.

(56) References Cited

U.S. PATENT DOCUMENTS 7,238,435 B2 7/2007 Kamatani et al.
7,396,598 B2 7/2008 Takeuchi et al.
7,700,200 B2 4/2010 Bulovi et al.
8,384,064 B2 2/2013 Akai et al.
2003/0042850 A1 3/2003 Bertram et al.
2003/0091862 A1* 5/2003 Tokito et al. ................. 428/690
2006/0043858 A1* 3/2006 Ikeda ...................... C07C 13/66 313/250
2007/0077594 A1* 4/2007 Hikmet et al. ................. 435/7.1
2007/0154734 A1* 7/2007 Wei et al. ..................... 428/690
2009/0184635 A1* 7/2009 Pan ........................ C08G 61/02 313/504
2009/0261717 A1* 10/2009 Buesing .................. C07C 13/62 313/504
2009/0314991 A1* 12/2009 Cho et al. ................ 252/301.36
2010/0213437 A1 8/2010 Akai et al.
2010/0224859 A1* 9/2010 Gough et al. .................. 257/13
(Continued)

FOREIGN PATENT DOCUMENTS

EP 0836366 * 4/1998
EP 1692732 A1 8/2006
(Continued)

OTHER PUBLICATIONS

Kido et al., "Single-layer white light-emitting organic electroluminescent devices based on dye dispersed poly(N-vinylcarbazole)", Applied Physics Letters, 1995, vol. 67, pp. 2281-2283.*
Sanetra et al., "Electroluminescence of Poly(N-Vinylcarbazole) and its Blends with Poly(4,4'-dialkyl-2,2'-bithiophene", Mol. Cryst. and Liq. Cryst., 2000, vol. 353, pp. 539-544.*
Dabbousi et al., "Electroluminescence from CdSe quantum-dot/polymer composites", Applied Physics Letters, 1995, vol. 66, pp. 1316-1318.*
(Continued)

*Primary Examiner* — Andrew K Bohaty
*Assistant Examiner* — Dylan C Kershner

(57) ABSTRACT

A composition is provided, including one or more quantum dots and at least one organic emitter. Further, a formulation including the composition, a use of the formulation and a device comprising the composition or formulation is provided.

8 Claims, 1 Drawing Sheet

(56) References Cited

U.S. PATENT DOCUMENTS

| | | | | |
|---|---|---|---|---|
| 2010/0237322 | A1 | 9/2010 | Okada et al. | |
| 2010/0237323 | A1* | 9/2010 | Akai | C09K 11/025 257/13 |
| 2011/0012505 | A1* | 1/2011 | Lin et al. | 313/504 |

FOREIGN PATENT DOCUMENTS

| | | | | | |
|---|---|---|---|---|---|
| JP | 2000104057 | A | * | 4/2000 | |
| JP | 2003073479 | A | | 3/2003 | |
| JP | 2003077675 | A | | 3/2003 | |
| JP | 2003342325 | A | | 12/2003 | |
| JP | 2004027088 | A | | 1/2004 | |
| JP | 2005502176 | A | | 1/2005 | |
| JP | 2005522005 | A | | 7/2005 | |
| JP | 2009099545 | A | | 5/2009 | |
| JP | 2009099563 | A | | 5/2009 | |
| WO | WO 2009038413 | A2 | * | 3/2009 | C08G 61/12 |
| WO | WO-2009041688 | A1 | | 4/2009 | |

OTHER PUBLICATIONS

Shi et al., "Anthracene derivatives for stable blue-emitting organic electroluminescence devices", Applied Physics Letters, 2002, vol. 80, pp. 3201-3203.*

Li et al., "White organic light-emitting devices with CdSe/ZnS quantum dots as a red emitter", 2005, Journal of Applied Physics, vol. 97, article 113501, pp. 1-4.*

Noguchi et al., Machine Translation of JP 2000-104057 A, date of Japanese language publication: 2000, pp. 1-14.*

Torriss, Badr, et al., "White Light-Emitting Organic Device with Electroluminescent Quantum Dots and Organic Molecules", Organic Electronics, vol. 10, (2009), pp. 1454-1458.

Huang, Hao, et al., "Bias-Induced Photoluminescence Quenching of Single Colloidal Quantum Dots Embedded in Organic Semiconductors", Nano Letters, vol. 7, No. 12, (2007), pp. 3781-3786.

Campbell, I.H., et al., "Efficient, Visible Organic Light-Emitting Diodes Utilizing a Single Polymer Layer Doped with Quantum Dots", Applied Physics Letters, vol. 92, (2008), pp. 043303-1-043303-3.

Raja, Inam Ul Haq, et al., "Recent Progress in the Development of Polymers for White Light-Emitting Polymer Devices", Monatsh Chem, vol. 139, (2008), pp. 725-737.

Suzuki, Mitsunori, et al., "High-Efficiency White Phosphorescent Polymer Light-Emitting Devices", IEEE Journal of Selected Topics in Quantum Electronics, vol. 10, No. 1, (2004), pp. 115-120.

Chen, Qiliang, et al., "Novel White-Light-Emitting Polyfluorenes with Benzothiadiazole and Ir Complex on the Backbone", Polymer, vol. 50, (2009), pp. 1430-1437.

Jiang, Jiaxing, et al., "High-Efficiency White-Light-Emitting Devices from a Single Polymer by Mixing Singlet and Triplet Emission", Adv. Mater., vol. 18, (2006), pp. 1769-1773.

International Search Report for PCT/EP2011/002127 dated Aug. 22, 2011.

* cited by examiner

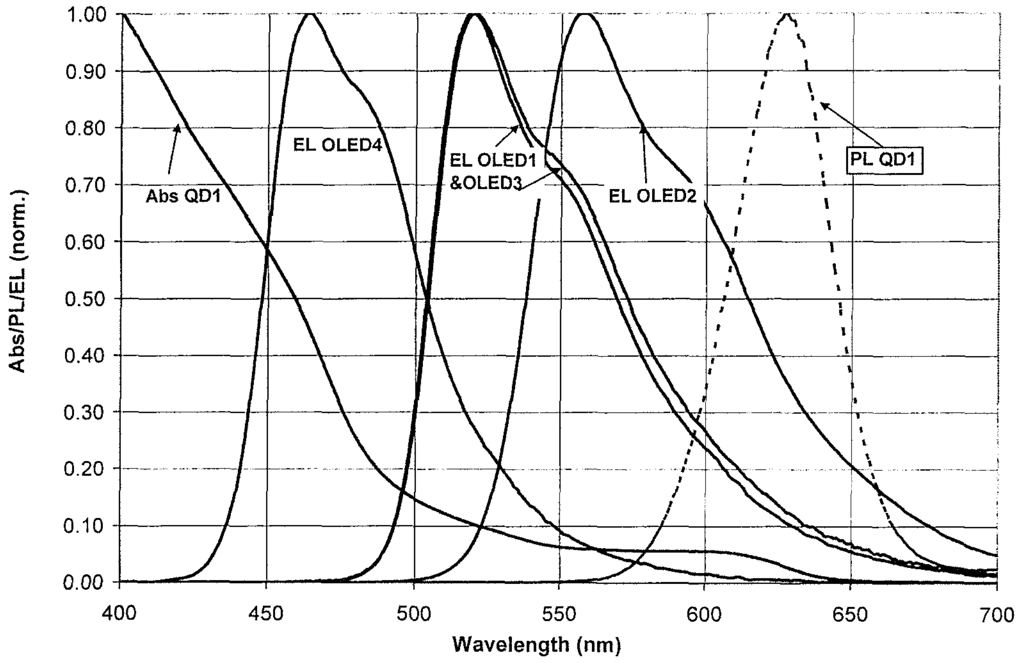
1.00
0.90
0.80
0.70
0.60
0.50
0.40
0.30
0.20
0.10
0.00
Abs/PL/EL (norm.)
400
450
500
550
600
650
700
Wavelength (nm)
Abs QD1
EL OLED4
EL OLED1
&OLED3
EL OLED2
PL QD1

COMPOSITIONS COMPRISING QUANTUM DOTS

RELATED APPLICATIONS

This application is a national stage application (under 35 U.S.C. § 371) of PCT/EP2011/002127, filed Apr. 28, 2011, which claims benefit of European Application No. 10005488.1, filed May 27, 2010. Both are incorporated herein by reference in their entirety.

The present invention is directed inter alia to a composition, a formulation including the composition, a use of the formulation and a device comprising the composition or formulation.

Organic light emitting diodes (OLEDs) as promising next generation display technology have drawn considerable attention since more than two decades. The performance of OLEDs, particularly those based on evaporated small molecules have shown excellent performance, like color, lifetime and driving voltage, allowing OLEDs to enter commercial applications. However, OLEDs reveal a broad emission spectrum due to the nature of organic molecules and the amorphous nature of the film. As a result, color purity is reduced, since the broad emission gives a mixed color. For commercial success, deep RGB colors are needed to achieve a large a color space, in particular for TV applications. The broad emission spectrum of RGB OLEDs leads to a smaller color space of a display as compared to inorganic LEDs. Further, the spectrum of a typical OLED includes an infrared portion above 680 nm. However, human eye can hardly see light beyond 680 nm. In other words, the emission of an OLED in the infrared part of the spectrum has no contribution to lumen for human eye. Hence, OLEDs tend to result in an energy loss in the infrared region of the spectrum. The same problem occurs in the blue or deep blue region of the emission spectrum of OLEDs.

In OLED devices, electrons and holes are injected from opposite electrodes and recombine to form excitons in order to form excited electronic singlet and/or triplet states and/or states of higher multiplicity. Radiative decay from singlet states is fast (fluorescence), but that from triplet and/or quintet excitons (phosphorescence) is inhibited by the requirement of spin conservation and is therefore often inefficient. The probability of singlet exciton formation for devices based on fluorescent materials is only 25%. The maximal internal quantum efficiency (IQE) is, therefore, 25%. This limit can be overcome by incorporating phosphorescent dopants, also called triplet emitters, to harvest both singlet and triplet excitons, having theoretically maximal IQE of 100%. Since the first report by Baldo et al., Nature 1998, 395, 151-154, phosphorescent OLEDs have attracted particularly great attention, and great improvements have been achieved. Especially, green and red phosphorescent OLEDs are almost mature for commercial applications. However, triplet emitter, i.e. emissive metal complexes, usually have like other organic compounds, quite broad emission bands.

In fact the term phosphorescence as used herein includes not only transitions from triplet states, but from any state with a spin multiplicity other than singlet.

In fact, there are some methods available to narrow the emission spectrum of OLEDs, such as using color filter or using microcavity effect. But both lead to a partially emission loss.

Therefore, it is highly desired to provide new emitters with intrinsic narrow emission bands for the application in organic light emitting devices.

As the counterpart of OLEDs, LEDs have much narrower emission band, but fabrication of LEDs is very expensive, and they are not suitable for large area device. The incorporation of crystalline inorganic layer into OLEDs is difficult. Thus, the combination of the advantages of both OLEDs and LED is highly desired, but challenging, and hasn't been realized so far.

The first soluble mono-dispersive colloidal nanocrystals based on CdE (E=S, Se, Te), also referred to herein as quantum dots or QDs, were produced using the so called TOPO (trioctyl phosphine oxide) method by Bawendi and later modified by Katari et al. A review on synthesis of QDs is given by Murray, Norris and Bawendi, "Synthesis and characterization of nearly monodisperse CdE (E=sulfur, selen, tellurium) semiconductor nanocrystallites", J. Am. Chem. Soc. 115[19], 8706-8715, 1993.

The first light-emitting diode based on CdSe QDs was reported by Alivisatos et al., "Light emitting diodes made from cadmium selenide nanocrystals and a semiconducting polymer", Nature (London) 370[6488], 354-357, 1994, where a multilayer consisting of QDs was sandwiched between PPV (poly(p-phenylene-vinylene)) and an electrode, giving emission in red upon applying voltage. Bulovic et al., "Electroluminescence from single monolayers of nanocrystals in molecular organic devices. Nature (London) 420[6917], 800-803, 2002 describe use of a single monolayer of CdSe QDs sandwiched between two organic layers.

One problem of known QD-LEDs is the huge energy level offset between the QDs and the adjacent organic layers, for example CdSe QDs have a HOMO of −6.6 eV and LUMO of −4.4 eV, as reported by Slooff et al., Appl. Phys. Lett. 2001, 78[15], 2122-2124 and Zhen et al., Macromol. Rapid Commun. 2006, 27[24], 2095-2100, but on the other side functional organic materials have usually a LUMO>−3.0 eV and HOMO>6.0 eV. The big energy offset prevents that QDs are efficiently electronically active in electroluminescent devices.

Some attempts have also been made to incorporate QDs into polymer OLEDs. For example, Li et al. reported in J. Appl. Phys. 97, 113501 (2005) a white OLED consisting of a blue-emitting poly[(9,9-dihexyloxyfluoren-2,7-diyl)-alt-co-(2-methoxy-5-{2-ethylhexyloxy}phenylen-1,4-diyl) (PFH-MEH) polymer doped with red-emitting QDs and a green emitting $Alq_3$; and Nir Tessler et al. reported in "Science Vol 295, 2002, p 1506" an near-infrared polymer nanocrystal light-emitting diodes using blends of InAs—ZnSe QDs with MEH-PPV or F6BT. However, though OLEDs based on conjugated polymers can easily be produced, the performance of polymer OLEDs is far behind the OLEDs based on evaporated SM OLEDs. Furthermore, conjugated polymers have, due to the extended conjugation, in general a quite low triplet level. However, no conjugated polymer matrix for green triplet OLEDs has been reported or disclosed so far.

In one embodiment, a composition is provided, including one or more quantum dots and at least one organic emitter which is chosen from a small molecule compound and a non-conjugated polymeric compound.

According to a further embodiment, a formulation including the composition of above one embodiment and at least one organic solvent is provided.

In another embodiment, a use of the formulation of above further embodiment for the manufacture of an electroluminescent device is provided.

A yet further embodiment provides an electroluminescent device including a layer including a composition of above one embodiment or a layer prepared by using the formulation of above another embodiment.

Surprisingly, according to embodiments described herein, composition with narrow emission bands for applications in electroluminescent devices can be provided by efficient energy transfer between QDs and organic emitter, e.g. for applications in light emitting devices, such as OLEDs. As a result, in electroluminescent devices of embodiments color purity is improved, color space enlarged and energy loss reduced.

The present invention relates to a composition, comprising one or more quantum dots (QDs) and at least one organic emitter which is chosen from a small molecule compound and a non-conjugated polymeric compound.

Preferably, the composition comprises 3 QDs, particularly preferably 2 QDs, and very particularly preferably 1 QD.

In a further preferred embodiment the composition comprises 3 organic emitters, particularly preferably 2 organic emitters, and very particularly preferably 1 organic emitter.

Preference is given to compositions comprising one QD and one organic emitter.

In a preferred embodiment the present invention related to a composition comprising one or more quantum dots and at least one organic emitter which is chosen from a fluorescent small molecule compound.

In another preferred embodiment the present invention related to a composition comprising one or more quantum dots and at least one organic emitter which is chosen from a phosphorescent non-conjugated polymeric compound.

In general, a quantum dot is a semiconductor whose excitons are confined in all three spatial dimensions. As a result, they have properties that are between those of bulk semiconductors and those of discrete molecules. There are several ways to make quantum dot structures, for example by chemical methods or by ion implantation, or in nanodevices made by state-of-the-art lithographic techniques.

The quantum dots (QDs) of the present invention refer to colloidal semiconductor nanocrystals, also known as colloidal quantum dots, or nanodots or nanocrystals, which are produced by chemical methods.

While any method known to the skilled person can be used to create QDs, perferably, a solution-phase colloidal method for controlled growth of inorganic QDs is used. The said colloidal methods can be referred to, e.g., Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J. Am. Chem. Soc. 115:8706 (1993). These methods allow low cost processability without the need for clean rooms and expensive manufacturing equipment. In these methods, metal precursors that undergo pyrolysis at high temperature are rapidly injected into a hot solution of organic surfactant molecules. These precursors break apart at high temperatures and react to nucleate nanocrystals. After this initial nucleation phase, a growth phase begins by the addition of monomers to the growing crystal. The result is crystalline nanoparticles in solution that have an organic surfactant molecule coating their surface.

In these methods, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape. The ratio of surfactants to monomer, surfactants to each other, monomers to each other, and the individual concentrations of monomers strongly influence the kinetics of growth.

The suitable semiconducting materials, which can be incoporated into QDs, are selected from elements of Group II-VI, such as CdSe, CdS, CdTe, ZnSe, ZnO, ZnS, ZnTe, HgS, HgSe, HgTe and alloys thereof such as CdZnSe; Group III-V, such as InAs, InP, GaAs, GaP, InN, GaN, InSb, GaSb, AlP, AlAs, AlSb and alloys such as InAsP, CdSeTe, ZnCdSe, InGaAs; Group IV-VI, such as PbSe, PbTe and PbS and alloys thereof; Group III-VI, such as InSe, InTe, InS, GaSe and alloys such as InGaSe, InSeS; Group IV semiconductors, such as Si and Ge alloys thereof, and combinations thereof in composite structures.

Further suitable semiconductor materials include those disclosed in U.S. patent application Ser. No. 10/796,832 and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlS, AlSb, BaS, BaSe, BaTe, CaS, CaSe, CaTe, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, and $Al_2CO$. Furthermore, further suitable semiconductor materials include combinations of the aforementioned semiconductors and/or combinations with core/shell, core multi-shell layered structures.

In some embodiments, the QDs may comprise a dopant from the group consisting of: a p-type dopant or an n-type dopant. The properties and synthesis of a doped QD can be referred to "n-type colloidal semiconductor nanocrystals" by Moonsub Shim & Philippe Guyot-Sionnest, Nature vol 407 (2000) p 981, and "Doped Nanocrystals" by Norris et al., Science, 319 (2008), p 1776. The QDs the present invention can also comprise II-VI or III-V semiconductors. Examples of 1'-VI or III-V semiconductor nanocrystals include any combination of an element from Group II, such as Zn, Cd and Hg, with any element from Group VI, such as S, Se, Te, Po, of the Periodic Table; and any combination of an element from Group III, such as B, Al, Ga, In, and TI, with any element from Group V, such as N, P, As, Sb and Bi, of the Periodic Table.

In quantum dots, photoluminescence and electroluminescence arise from the band edge states of the nanocrystal. The radiative band-edge emission from nanocrystals competes with non-radiative decay channel originating from surface electronic states, as reported by X. Peng, et al., J. Am. Chem. Soc. Vol119:7019-7029 (1997). Thus, the presence of surface defects such as dangling bonds provide non-radiative recombination centers and lower emission efficiency. An efficient method to passivate and remove the surface trap states is to epitaxially grow an inorganic shell material on the surface of the nanocrystal, as disclosed by X. Peng, et al., J. Am. Chem. Soc. Vol 119:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials. Additionally, the spherical shape acts to minimize interfacial strain energy from the large radius of curvature, thereby preventing the formation of dislocations that could degrade the optical properties of the nanocrystal system.

In a preferred embodiments, ZnS can be used as the shell material using known synthetic processes.

In a particularly preferred embodiment, the QD of the invention comprises semiconducting materials selected from Group II-VI semiconductors, alloys thereof and core/shell structures made there from. In further embodiments, the Group II-VI semiconductors are CdSe, CdS, CdTe, ZnSe, ZnS, ZnTe, alloys thereof, combinations thereof and core/shell, core multi-shell layered-structures thereof.

In some embodiments, the QDs of the present invention comprise further ligands conjugated, cooperated, associated or attached to their surface. Suitable ligands include any group known to those skilled in the art, including those disclosed in U.S. patent application Ser. No. 10/656,910 and U.S. Provisional Patent Application No. 60/578,236. Use of such ligands can enhance the ability of the QDs to incorporate into various solvents and matrix materials, including polymers. Further preferred ligands are such having a “head-body-tail” structure, as disclosed in US2007/0034833A1, wherein further preferably the “body” has an electron or hole transport function, as disclosed in US20050109989A1.

The term quantum dots (QDs) refers to nanocrystals that are substantially mono-disperive in size. A QD has at least one region or characteristic dimension with a dimension of less than about 500 nm, and down to on the order of less than about 1 nm. The term mono-dispersive means the size distribution is within +−10% of the stated value, for example a mono-dispersive nanocrystals of 100 nm in diameter encompasses a range of sizes from 90 nm or larger to 110 nm or smaller.

Due to the finite size of the QDs, especially core-shell QDs, they display unique optical properties compared to their bulk counterparts. The emission spectrum is defined by a single Gaussian peak, which arises from the band-edge luminescence. The emission peak location is determined by the core particle size as a direct result of quantum confinement effects. The electronic & optical properties are discussed by Al. L. Efros and M. Rosen in Annu. Rev. Mater. Sci. 2000. 30:475-521.

The organic emitter, including small molecule emitter, small molecule singlet emitter, triplet emitter, and non-conjugated polymeric emissive material of embodiments described herein are functional materials. The term functional material used herein preferably refers to organic functional materials. The term organic functional materials may further refer to organic conductors, organic semiconductors, organic dyes, organic fluorescent compounds, organic phosphorescent compounds, organic photoabsorbing compounds, organic photosensing compounds, organic photo sensitizer and other organic photoactive compounds. The term organic functional material may also include organo-metallic complexes of transition metals, rare earths, lanthanides and actinides.

The organic functional material may be chosen from the group of small molecules, polymers, a non-conjugated side-chain polymer, a non-conjugated backbone polymer, oligomers, or dendrimers, blends or mixtures thereof.

The term small molecule as used herein is defined as molecule not being a polymer, oligomer, dendrimer, or a blend. In particular, repeating structures are absent in small molecules. The molecular weight of small molecules is typically in the range of polymers with a low number of repeating units, oligomers or less. The molecular weight of the small molecule may be preferably below 4000 g/mol, particularly preferably below 3000 g/mol, and very particularly preferably below 2000 g/mol.

The polymers of embodiments preferably may have 10 to 10000, particularly preferably 20 to 5000 and very particularly preferably 50 to 2000 repeating units. Oligomers according to embodiments may have 2 to 9 repeating units. The branching index of the polymers and oligomers is between 0 (linear polymer without branching) and 1 (completely branched dendrimer). The term dendrimer as used herein is defined according to M. Fischer et al. in Angew. Chem., Int. Ed. 1999, 38, 885.

The molecular weight ($M_W$) of the polymers of embodiments may preferably be in the range of about 10000 to about 2000000 g/mol, particularly preferably in the range of about 100000 to about 1500000 g/mol, and very particularly preferably in the range of about 200000 to about 1000000 g/mol. The determination of MW can be performed according to standard techniques known to the person skilled in the art by employing gel permeation chromatography (GPC) with polystyrene as internal standard, for instance.

A blend may be a mixture including at least one polymeric, dendrimeric, or oligomeric component.

Organic functional materials according to embodiments described herein are often characterized by their molecular frontier orbitals, i.e. the highest occupied molecular orbital (HOMO), sometimes also referred to as valence band, and the lowest unoccupied molecular orbital (LUMO), sometimes also referred to as conduction band. The HOMO and LUMO levels are routinely measured, by e.g. XPS=X-ray photoelectron spectroscopy, UPS=ultra-violet photoelectron spectroscopy or CV=Cyclovoltammetry, or calculated by quantum chemical methods such as (time dependent) DFT (density functional theory). Absolute values of these energy levels may significantly depend on the method used. The applicants established a consistent combination method to determine the energy levels of organic semiconductors. The HOMO/LUMO levels of a set of semiconductors (more than 20 different semiconductors) are measured by CV with a reliable evaluation method and also calculated by the DFT of Gaussian 03W with the same correction functional, for example B3PW91 and the same basis set, for example 6-31 G(d). The calculated values are then calibrated according to the measured values. Such calibration factor is used for further calculation. The agreement between calculated and measured values is very good. Therefore, the comparison of the energy levels of embodiments is set on a sound base. The energy gaps or band gaps are obtained by the difference between HOMO and LUMO energy levels.

The compositions according to embodiments may include one or more organic functional materials chosen from emitters. The term emitter refers to a material which, upon receiving excitonic energy by any kind of energy transfers from other materials, or by forming an exciton either electrically or optically, undergoes radiative decay to emit light. There are two classes of emitters, singlet emitters, also referred to as fluorescent emitters, and triplet emitters, also referred to herein as phosphorescent emitters. The term singlet emitter relates to materials or compounds which undergo a radiative transition from an excited singlet state to its ground state. The term triplet emitter, as used herein, may relate to luminescent materials or compounds which include transition metals. This typically includes materials emitting light caused by spin forbidden transition(s), e.g., transitions from excited triplet states or from states with even higher spin multiplicity.

The term dopant as employed herein is also used for the term emitter or emitter material.

In a preferred embodiment, the composition according to the invention comprises a mixture comprising at least one quantum dot (QD), and one singlet emitter and one host materials.

The singlet emitter compound may be required to have a smaller band gap as compared to the host compound. In general, smaller band gaps can be achieved by extending the π-electron system of conjugated molecular systems. Singlet emitter compounds tend, therefore, to have more extended conjugated π-electron systems than host molecules. Many examples have been published, e.g. styrylamine derivatives as disclosed in JP 2913116B and WO 2001/021729 A1, and indenofluorene derivatives as disclosed in WO 2008/006449 and WO 2007/140847.

The organic emitter is preferably chosen from styrylamine derivatives, indenofluorene derivatives, polyaromatic compounds, anthracene derivatives, tetracene derivatives, xanthene derivatives, perylene derivatives, phenylene derivatives, fluorene derivatives, arylpyrenes derivatives, arylenevinylenes derivatives, rubrene derivatives, coumarine derivatives, rhodamine derivatives, quinacridone derivatives, dicyanomethylenepyrane derivatives, thiopyrans, polymethine derivatives, pyrylium and thiapyrylium salts, periflanthene derivatives, indenoperylene derivatives, bis(azinyl)-imine-boron compounds, bis(azinyl)methene compounds, carbostyryl compounds, monostyrylamines, distyrylamines, tristyrylamines, tetra-styrylamines, styrylphosphines, styryl ethers, arylamines, indenofluorene-amines and indenofluorene-diamines, benzoindenofluorene-amines, benzoindenofluorene-diamines, dibenzoindenofluorene-amines, dibenzo-indenofluorene-diamines, substituted or unsubstituted tristilbene-amines, distyrylbenzene and distyrylbiphenyl derivatives, triarylamines, naphthalene derivatives, anthracene derivatives, tetracene derivatives, fluorene derivatives, periflanthene derivatives, indenoperylene derivatives, phenan-threne derivatives, perylene derivatives, pyrene derivatives, chrysene derivatives, decacyclene derivatives, coronene derivatives, tetraphenyl-cyclopentadiene derivatives, pentaphenylcyclopentadiene derivatives, fluorene derivatives, spirofluorene derivatives, pyran derivatives, oxazone derivatives, benzoxazole derivatives, benzothiazole derivatives, benz-imidazole derivatives, pyrazine derivatives, cinnamic acid esters, diketo-pyrrolopyrrole derivatives, and acridone derivatives.

Blue fluorescent emitters may preferably be polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imine-boron compounds (US 2007/0092753 A1), bis(azinyl)methene compounds and carbostyryl compounds.

Further preferred blue fluorescent emitters may be emitters which are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

Preferred fluorescent dopants according to embodiments may be chosen from the class of the monostyrylamines, the distyrylamines, the tristyryl-amines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups may particularly preferably be stilbenes, which may also be further substituted. The corresponding phosphines and ethers are defined analogously to the amines. For the purposes of this invention, an arylamine or an aromatic amine is taken to optionally mean a compound which contains three substituted or unsubstituted aromatic or heteroaromatic ring systems bonded directly to the nitrogen. At least one of these aromatic or hetero-aromatic ring systems may preferably be condensed ring system, preferably having at least 14 aromatic ring atoms.

Preferred examples thereof are aromatic anthracene-amines, aromatic anthracene-diamines, aromatic pyrene-amines, aromatic pyrene-diamines, aromatic chrysene-amines and aromatic chrysene-diamines. An aromatic anthracene-amine may be taken to mean a compound in which one diaryl-amino group is bonded directly to an anthracene group, preferably in the 9 position. An aromatic anthracene-diamine may be taken to mean a compound in which two diarylamino groups are bonded directly to an anthracene group, preferably in the 9,10-position. Aromatic pyrene-amines, pyrene-diamines, chrysene-amines and chrysene-diamines are defined analogously thereto, where the diarylamino groups on the pyrene are preferably bonded in the 1 position or in the 1,6-position.

Further preferred fluorescent dopants may be chosen from indenofluorene-amines and indenofluorene-diamines, for example in accordance with WO 2006/122630, benzoindenofluorene-amines and benzoindenofluorene-diamines, for example in accordance with WO 2008/006449, and dibenzoindenofluorene-amines and dibenzoindenofluorene-diamines, for example in accordance with WO 2007/140847.

Examples of dopants from the class of the styrylamines are substituted or unsubstituted tristilbene-amines or the dopants described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines are found in US 2007/0122656 A1.

Particularly preferred styrylamine dopants and triarylamine dopants are the compounds of the formulae (1) to (6) and as disclosed in U.S. Pat. No. 7,250,532 B2, DE 102005058557 A1, CN 1583691 A, JP 08053397 A, U.S. Pat. No. 6,251,531 B1, and US 2006/210830 A.

Formula (1)

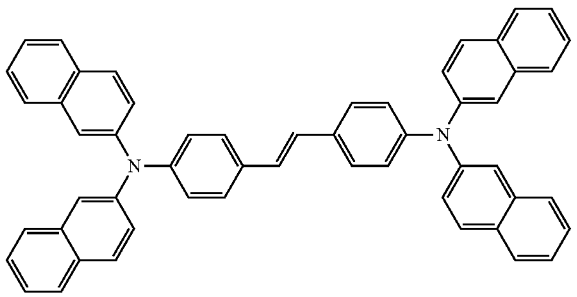

Formula (2)

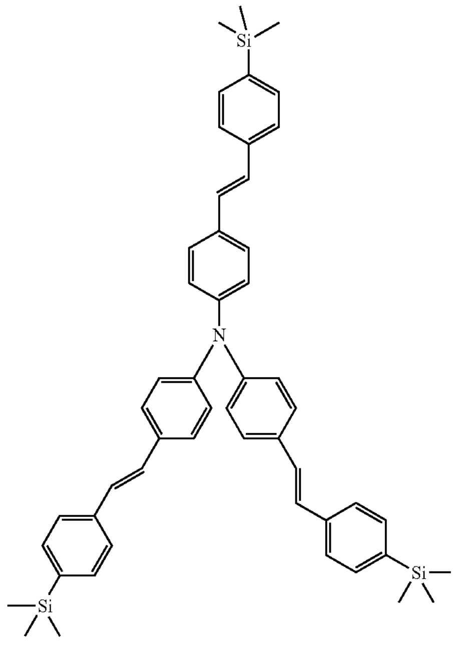

Formula (3)

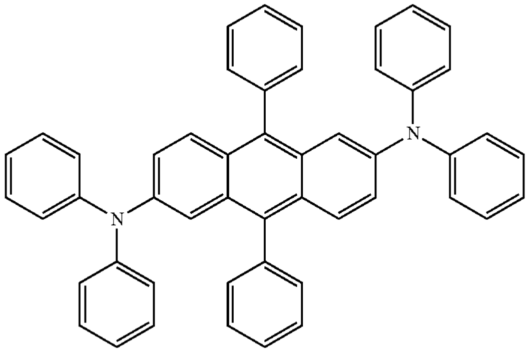

-continued

Formula (4)

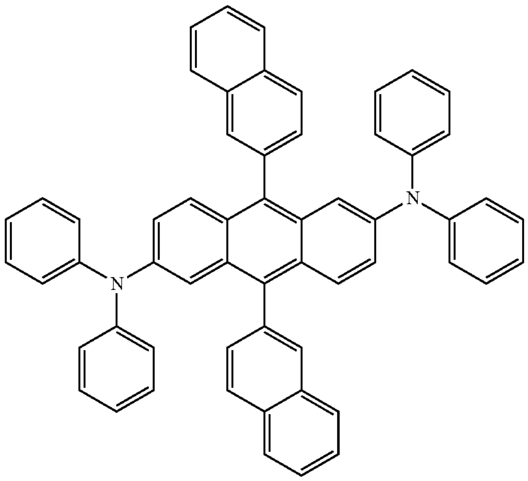

Formula (5)

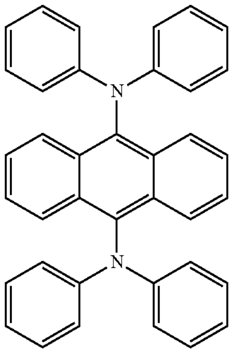

Formula (6)

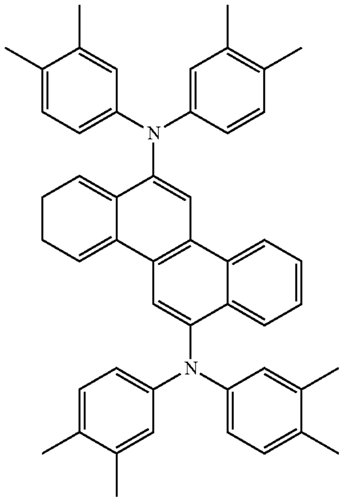

Further preferred fluorescent dopants may be chosen from the group of triarylamines as disclosed in EP 1957606 A1 and US 2008/0113101 A1.

Further preferred fluorescent dopants may be chosen from derivatives of naphthalene, anthracene, tetracene, fluorene, periflanthene, indeno-perylene, phenanthrene, perylene (US 2007/0252517 A1), pyrene, chrysene, decacyclene, coronene, tetraphenylcyclopentadiene, penta-phenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, particular preference may be given to 9,10-substituted anthracenes, such as, for example, 9,10-diphenylanthracene and 9,10-bis(phenylethynyl)anthracene. 1,4-Bis(9'-ethynylanthracenyl)-benzene may be also a preferred dopant.

In principle any host material known to one skilled in the art can be employed in compositions according to embodiments described herein. Depending on the kind of emitter employed host materials can be separated into two categories, hosts for fluorescent emitter and hosts for phosphorescent emitter, whereby the latter is often referred to as matrix or matrix material.

Compositions according to embodiments may also include more than one host material, preferably it may include 3 host materials, particularly preferably it may include 2 host materials, and very particularly preferably one host material. If a composition according to embodiments includes at least two host materials, the host materials are also referred to as co-host or co-host materials.

Host materials are usually used in combination with emitters and may have larger energy gaps between the HOMO and the LUMO as compared to emitter materials. In addition, host materials can behave either as an electron transport material or as a hole transport material. Host materials can also have both electron and hole transport properties. In case that singlet transitions are predominantly responsible for photoluminescence in OLEDs, a maximal overlap between the absorption spectrum of the emitter with the photoluminescence spectrum of the host material is highly desirable. This ensures the energy transfer from the host material to the emitter.

A host material is also called matrix or matrix material, particularly if a host is meant which is used in combination with a phosphorescent emitter in an OLED. And for a copolymer, including an emitter unit, the polymer backbone may have the same function as a host and may be meant when reference is made to a host.

Preferred host materials suitable for fluorescent emitter may be chosen from anthracenes, benzanthracenes, indenofluorenes, fluorenes, spiro-bifluorenes, phenanthrenes, dehydrophenanthrenes, thiophenes, triazines, imidazole and derivatives thereof.

Particularly preferred host materials for fluorescent emitter may be chosen from the classes of the oligoarylenes (for example 2,2',7,7'-tetra-phenylspirobifluorene in accordance with EP 676461 or dinaphthyl-anthracene), in particular the oligoarylenes containing condensed aromatic groups, such as, for example, phenanthrene, tetracene, coronene, chrysene, fluorene, spirofluorene, perylene, phthaloperylene, naphthalo-perylene, decacyclene, rubrene, the oligoarylenevinylenes (for example 4,4'-bis(2,2-diphenylethenyl)-1,1'-biphenyl (DPVBi) or 4,4-bis-2,2-diphenyl-vinyl-1,1-spirobiphenyl (spiro-DPVBi) in accordance with EP 676461), the polypodal metal complexes (for example in accordance with WO 2004/081017), in particular metal complexes of 8 hydroxyquinoline, for example aluminium (III)tris(8-hydroxyquinoline) (aluminium quinolate, $Alq_3$) or bis(2-methyl-8-quinolinolato)-4-(phenylphenolinolato)aluminium, also with imidazole chelate (US 2007/0092753 A1) and quinoline-metal complexes, aminoquinoline-metal complexes, benzoquinoline-metal complexes, the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (e.g. DE 102007024850). Particularly preferred host materials may be chosen from the classes of the oligoarylenes, containing naphthalene, anthracene, benzanthracene and/or pyrene, or atropisomers of these compounds, the ketones, the phosphine oxides and the sulfoxides. Very particularly preferred host materials may be chosen from the classes of the oligoarylenes, containing anthracene, benzanthracene and/or pyrene, or atropisomers of these compounds. For the purposes of this invention, an oligoarylene is intended to be taken to optionally mean a compound in which at least three aryl or arylene groups are bonded to one another.

Further preferred host materials for fluorescent emitter may be chosen, in particular, from compounds of the Formula (7)

$$Ar^4—(Ar^5)_p—Ar^6 \qquad \text{Formula (7)}$$

wherein $Ar^4$, $Ar^5$, $Ar^6$ are on each occurrence, identically or differently, an aryl or heteroaryl group having 5 to 30 aromatic ring atoms, which may be substituted by one or more radicals and p is 1, 2, or 3, the sum of the π-electrons in $Ar^4$, $Ar^5$ and $Ar^6$ is at least 30 if p=1 and is at least 36 if p=2 and is at least 42 if p=3.

It may be particularly preferred in the host materials of the formula (7) for the group $Ar^5$ to stand for anthracene, which may be substituted by one or more radicals $R^1$, and for the groups $Ar^4$ and $Ar^6$ to be bonded in the 9 and 10-positions. Very particularly preferably, at least one of the groups $Ar^4$ and/or $Ar^6$ may be a condensed aryl group chosen from 1- or 2-naphthyl, 2-, 3- or 9-phenanthrenyl or 2-, 3-, 4-, 5-, 6- or 7-benzanthracenyl, each of which may be substituted by one or more radicals $R^1$. Anthracene-based compounds are described in US 2007/0092753 A1 and US 2007/0252517 A1, for example 2-(4-methylphenyl)-9,10-di-(2-naphthyl) anthracene, 9-(2-naphthyl)-10-(1,1'-biphenyl)anthracene and 9,10-bis[4-(2,2-diphenyl-ethenyl)phenyl]anthracene, 9,10-diphenylanthracene, 9,10-bis(phenyl-ethynyl)anthracene and 1,4-bis(9'-ethynylanthracenyl)benzene. Preference may be also given to host materials containing two anthracene units (US 2008/0193796 A1), for example 10,10'-bis [1,1',4',1"]terphenyl-2-yl-9,9'-bisanthracenyl.

Further preferred host materials may be derivatives of arylamine, styrylamine, fluorescein, perynone, phthaloperynone, naphthaloperynone, diphenylbutadiene, tetraphenylbutadiene, cyclopentadienes, tetraphenyl-cyclopentadiene, pentaphenylcyclopentadiene, coumarine, oxadiazole, bisbenzoxazoline, oxazone, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazines, stilbene, styrylarylene derivatives, for example 9, 10-bis[4-(2,2-diphenylethenyl)-phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, mellocyanine, acridone, quinacridone, cinnamic acid esters and fluorescent dyes.

Particular preference may be given to derivatives of arylamine and styrylamine, for example 4,4'-bis[N-(1-naphthyl)-N-(2-naphthyl)amino]biphenyl (TNB).

Preferred compounds with oligoarylene as hosts for fluorescent emitter may be compounds as disclosed in, e.g., US 2003/0027016 A1, U.S. Pat. No. 7,326,371 B2, US 2006/043858 A, U.S. Pat. No. 7,326,371 B2, US 2003/0027016

A1, WO 2007/114358, WO 2008/145239, JP 3148176 B2, EP 1009044, US 2004/018383, WO 2005/061656 A1, EP 0681019B1, WO 2004/013073A1, U.S. Pat. No. 5,077,142, WO 2007/065678, and US 2007/0205412 A1. Particularly preferred oligoarylene-based compounds may be compounds having the formulae (8) to (14).
Formula (8)
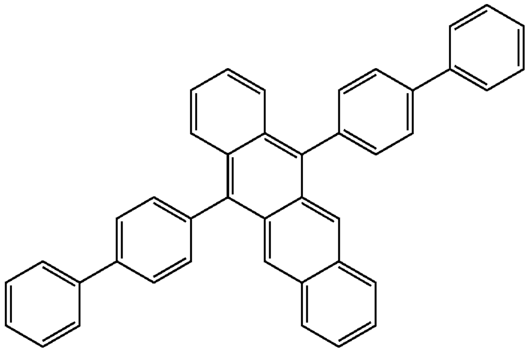
Formula (9)
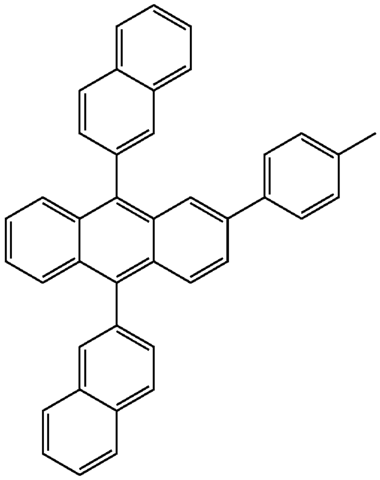
Formula (10)
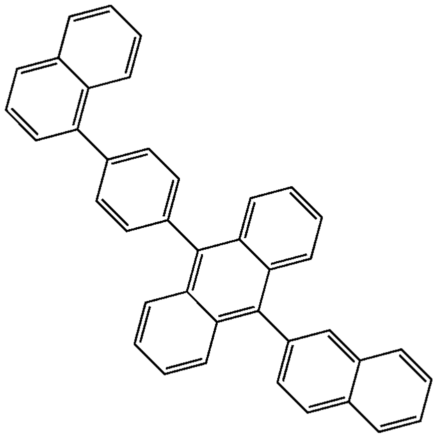
-continued
Formula (11)
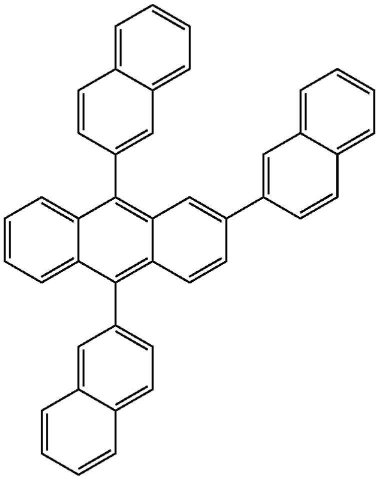
Formula (12)
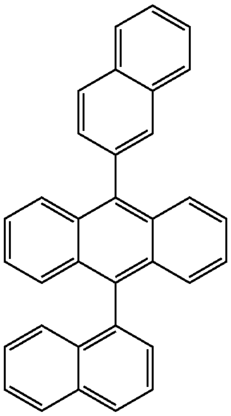
Formula (13)
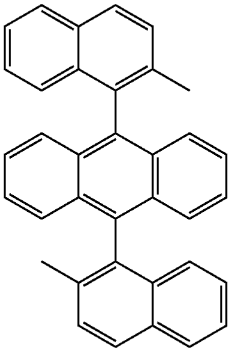

-continued

Formula (14)

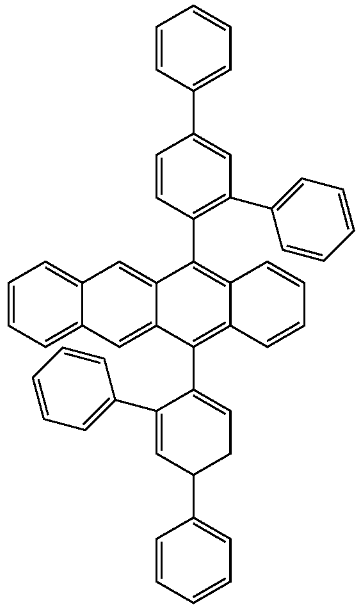

Further host materials for fluorescent emitter can be chosen from spirobifluorene and derivates thereof, for example Spiro-DPVBi as disclosed in EP 0676461 and indenofluorene as disclosed in U.S. Pat. No. 6,562,485.

Preferred host materials for phosphorescent emitter, i.e. matrix materials, may be chosen from ketones, carbazoles, triarylamines, indenofluorenes, fluorenes, spirobifluorenes, phenanthrenes, dehydrophenanthrenes, thiophenes, triazines, imidazoles and their derivatives. Some preferred derivatives are described below in more details.

In a preferred embodiment, the host materials is a small molecule comprising an emitter group as described above and bellow.

In another preferred embodiment, the host materials is a conjugated polymer comprising an emitter group as a repeating unit as described bellow.

In yet another preferred embodiment, the host materials is a non-conjugated polymer comprising an emitter group as a repeating unit as described bellow.

In another very preferred embodiment, the composition according to the present invention comprises a mixture comprising at least one QD, and one triplet emitter and one matrix materials.

Preference is given to a mixture comprising one QD, one triplet emitter and one matrix material.

Triplet emitter refers herein also to phosphorescent emitter as defined above.

The compositions according to embodiments may include one or more organic functional materials chosen from metal complexes. According to quantum mechanics the transition from excited states with high spin multiplicity, e.g. from excited triplet states, to ground state is forbidden. However, the existence of a heavy atom, for example iridium, osmium, platinum and europium, results in a strong spin-orbit coupling, i.e. the excited singlet and triplet are mixed so that triplet gains some singlet character; and if singlet-triplet mixing yields a radiative decay rate faster than the non-radiative event, then the luminance can be efficient. This kind of emission can be achieved using a metal complex, as firstly reported by Baldo et al.; Nature 395, 151-154 (1998).

Further metal complexes can also function as efficient and broad-band light absorbing materials or dyes, as for example a Ru complex reported by B. O'Regan & M. Graetzel, Nature 353, 737 (1991).

Examples of phosphorescent emitters are revealed by the applications WO 00/70655, WO 01/41512, WO 02/02714, WO 02/15645, EP 1191613, EP 1191612, EP 1191614 and WO 2005/033244. In general, all phosphorescent complexes as used in accordance with the prior art for phosphorescent OLEDs and as are known to the person skilled in the art in the area of organic electroluminescence are suitable.

The phosphorescent emitter may be a metal complex, preferably with the formula $M(L)_z$, wherein M is a metal atom, L is in each occurrence independently of one another an organic ligand that is bonded to or coordinated with M via one, two or more positions, and z is an integer≥1, preferably 1, 2, 3, 4, 5 or 6, and wherein, optionally, these groups are linked to a polymer via one or more, preferably one, two or three positions, preferably via the ligands L.

M may be in particular a metal atom chosen from transition metals, preferably chosen from transition metals of group VIII, or lanthanoides, or actinides, particularly preferably chosen from Rh, Os, Ir, Pt, Pd, Au, Sm, Eu, Gd, Tb, Dy, Re, Cu, Zn, W, Mo, Pd, Ag, or Ru, and very particularly preferably chosen from Os, Ir, Ru, Rh, Re, Pd, or Pt. M may also be Zn.

Preferred ligands L may be 2 phenylpyridine derivatives, 7,8-benzo-quinoline derivatives, 2 (2-thienyl)pyridine derivatives, 2 (1-naphthyl)-pyridine derivatives or 2 phenylquinoline derivatives. All these compounds may be substituted, for example by fluoro- or trifluoromethyl substituents for blue. Auxiliary ligands are preferably acetylacetonate or picric acid.

In particular, complexes of Pt or Pd with tetradentate ligands of the formula (15) as disclosed in US 2007/0087219 A1, wherein $R^1$ to $R^{14}$ and $Z^1$ to $Z^5$ are as defined in the reference, Pt porphyrin complexes having an enlarged ring system (US 2009/0061681 A1) and Ir complexes are suitable, for example 2,3,7,8,12,13,17,18-octaethyl-21H, 23H-porphyrin-Pt(II), tetraphenyl-Pt(II)-tetrabenzoporphyrin (US 2009/0061681 A1), cis-bis(2-phenylpyridinato-N,C2')Pt(II), cis-bis(2-(2'-thienyl)pyridinato-N,C3')Pt(II), cis-bis(2-(2'-thienyl)quinolinato-N,C5')Pt(II), (2-(4,6-difluorophenyl)pyridinato-N,C2')Pt(II) acetylacetonate, or tris(2-phenylpyridinato-N,C2')Ir(III) ($Ir(ppy)_3$, green), bis(2-phenylpyridinato-N,C2)Ir(III) acetylacetonate ($Ir(ppy)_2$ acetylacetonate, green, US 2001/0053462 A1, Baldo, Thompson et al. Nature 403, (2000), 750-753), bis(1-phenylisoquinolinato-N,C2')(2-phenylpyridinato-N,C2')iridium (III), bis(2-phenylpyridinato-N,C2')(1-phenylisoquinolinato-N,C2')iridium(III), bis(2-(2'-benzothienyl)pyridinato-N,C3')iridium(III) acetylacetonate, bis(2-(4',6'-difluorophenyl)pyridinato-N,C2')iridium(III) piccolinate (Firpic, blue), bis(2-(4',6'-difluorophenyl)pyridinato-N,C2')Ir(III) tetrakis(1-pyrazolyl)borate, tris(2-(biphenyl-3-yl)-4-tert-butylpyridine)-iridium(III), $(ppz)_2Ir(5phdpym)$ (US 2009/0061681 A1), $(45ooppz)_2Ir(5phdpym)$ (US 2009/0061681 A1), derivatives of 2 phenylpyridine-Ir complexes, such as, for example, iridium(III) bis(2-phenylquinolyl-N,C2')acetylacetonate (PQIr), tris(2-phenylisoquinolinato-N,C)Ir(III) (red), bis(2-(2'-benzo[4,5-a]thienyl)pyridinato-N,C3)Ir acetylacetonate ([Btp2Ir(acac)], red, Adachi et al. Appl. Phys. Lett. 78 (2001), 1622-1624).

Formula (15)

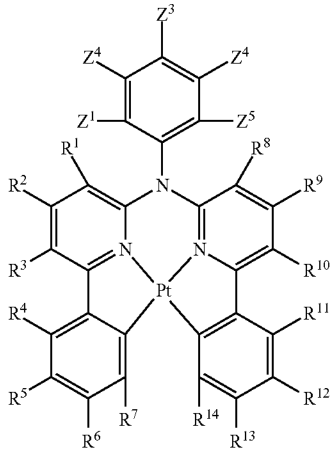

Also suitable are complexes of trivalent lanthanides, such as, for example, $Tb^{3+}$ and $Eu^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl diimine complexes (Wrighton, JACS 96, 1974, 998 inter alia), Os(II) complexes with cyano ligands and bipyridyl or phenanthroline ligands (Ma et al., Synth. Metals 94, 1998, 245) or $Alq_3$ without a host.

Further phosphorescent emitters with tridentate ligands are described in U.S. Pat. No. 6,824,895 and U.S. Pat. No. 7,029,766. Red-emitting phosphorescent complexes are mentioned in U.S. Pat. No. 6,835,469 and U.S. Pat. No. 6,830,828.

A particularly preferred phosphorescent dopant may be a compound with the formula (16) and further compounds as disclosed, e.g., in US 2001/0053462 A1.

A particularly preferred phosphorescent dopant may be a compound with the formula (17) and further compounds as disclosed, e.g., in WO 2007/095118 A1

Formula (16)

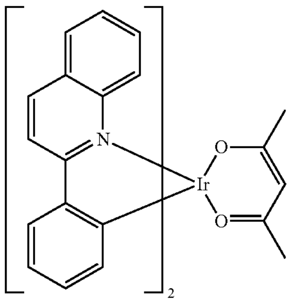

Formula (17)

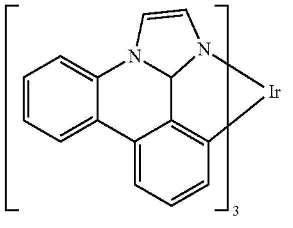

Further derivatives are described in U.S. Pat. No. 7,378,162 B2, U.S. Pat. No. 6,835,469 B2, and JP 2003/253145 A.

Further to a metal complex mentioned elsewhere herein, a suitable metal complex according to embodiments can be chosen from transition metals, rare earth elements, lanthanides and actinides and may be also subject of embodiments described herein. Preferably the metal may be chosen from Ir, Ru, Os, Eu, Au, Pt, Cu, Zn, Mo, W, Rh, Pd, or Ag.

If a phosphorescent emitter is employed, e.g. as electroluminescent component in organic light emitting diodes (OLEDs), the matrix material should fulfil rather different characteristics as compared to matrix materials used for fluorescent emitter. The matrix materials used for phosphorescent emitter should have a triplet level which is higher in energy as compared to the triplet level of the emitter. The matrix material can either transport electrons or holes or both of them. In addition, the emitter is supposed to have large spin-orbital coupling constants in order to facilitate singlet-triplet mixing sufficiently. This can be enabled by using metal complexes.

Preferred matrix materials may be N,N-biscarbazolylbiphenyl (CBP), carbazole derivatives (for example in accordance with WO 2005/039246, US 2005/0069729, JP 2004/288381, EP 1205527 or DE 102007002714), azacarbazoles (for example in accordance with EP 1617710, EP 1617711, EP 1731584, JP 2005/347160), ketones (for example in accordance with WO 2004/093207), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (e.g. in accordance with DE 102008017591), azaboroles or boronic esters (for example in accordance with WO 2006/117052), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylene-diamine derivatives, tertiary aromatic amines, styrylamines, indoles, anthrone derivatives, fluorenone derivatives, fluorenylidenemethane derivatives, hydrazone derivatives, silazane derivatives, aromatic dimethyl-idene compounds, porphyrin compounds, carbodiimide derivatives, diphenylquinone derivatives, phthalocyanine derivatives, metal complexes of 8 hydroxyquinoline derivatives, such as, for example, $Alq_3$, the 8 hydroxyquinoline complexes may also contain triarylaminophenol ligands (US 2007/0134514 A1), various metal complex-polysilane compounds with metal phthalocyanine, benzoxazole or benzothiazole as ligand, hole-conducting polymers, such as, for example, poly(N-vinylcarbazole) (PVK), aniline copolymers, thiophene oligomers, polythiophenes, polythiophene derivatives, polyphenylene derivatives, polyfluorene derivatives.

Further particularly preferred matrix materials may be chosen from compounds including indolocarbazoles and their derivatives (e.g. formulae (18) to (24)), as disclosed for examples in DE 102009023155.2, EP 0906947B1, EP 0908787B1, EP 906948B1, WO 2008/056746A1, WO 2007/063754A1, WO 2008/146839A1, and WO 2008/149691A1.

Formula (18)

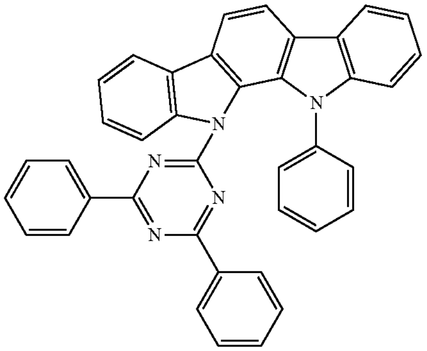

Formula (19)

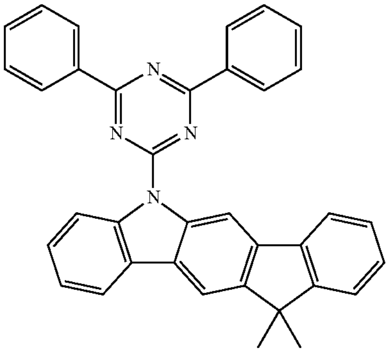

Formula (20)

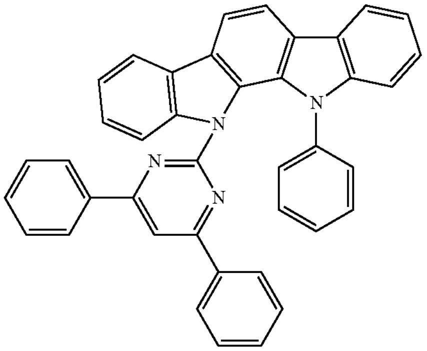

Formula (21)

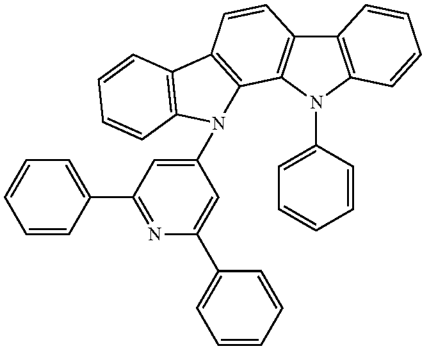

-continued

Formula (22)

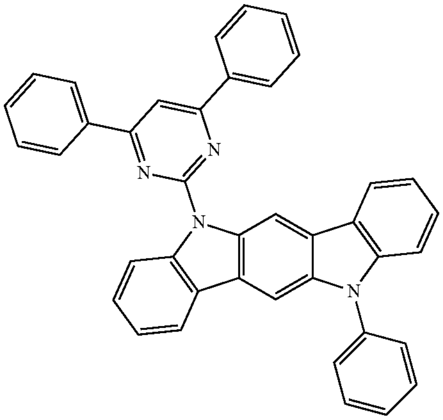

Formula (23)

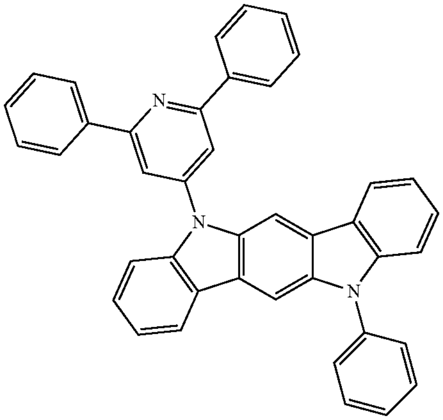

Formula (24)

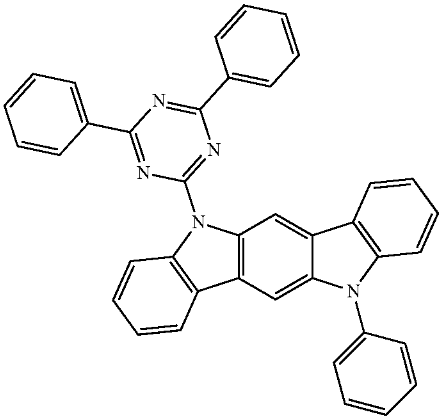

Examples of preferred carbazole derivatives are, 1,3-N, N-dicarbazolebenzene (=9,9'-(1,3-phenylene)bis-9H-carbazole) (mCP), 9,9'-(2,2'-dimethyl[1,1'-biphenyl]-4,4'-diyl) bis-9H-carbazole (CDBP), 1,3-bis(N,N'-dicarbazole) benzene (=1,3-bis(carbazol-9-yl)benzene), PVK (polyvinylcarbazole), 3,5-di(9H-carbazol-9-yl)biphenyl and compounds of the formulae (25) to (29).

Formula (25)
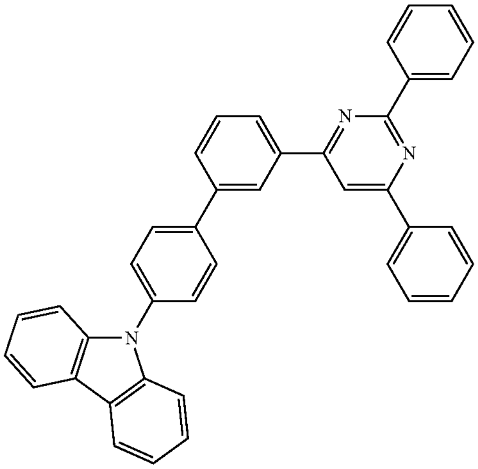
Formula (26)
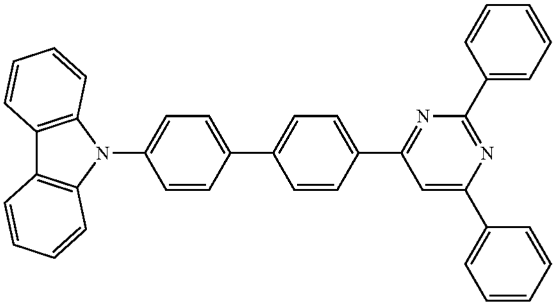
Formula (27)
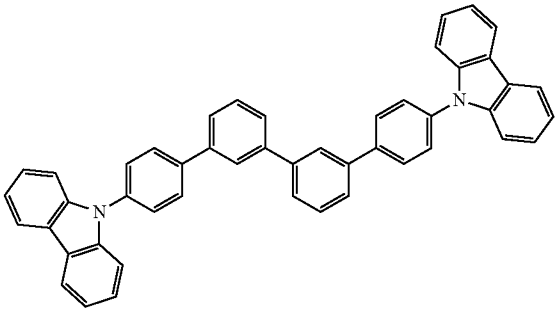
Formula (28)
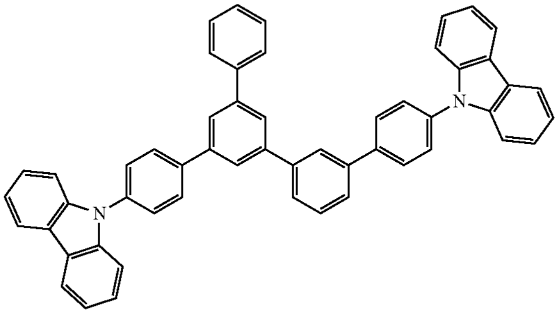
-continued
Formula (29)
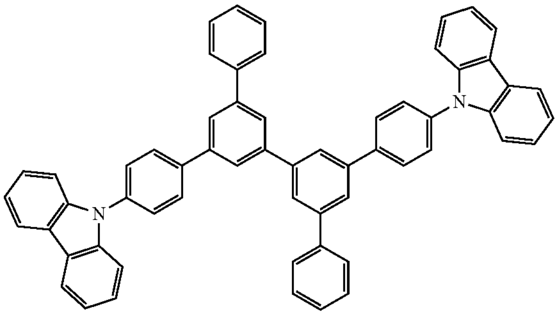
Preferred Si tetraaryl compounds are, for example, (US 2004/0209115, US 2004/0209116, US 2007/0087219 A1, US 2007/0087219 A1) the compounds of the formulae (30) to (35).
Formula (30)
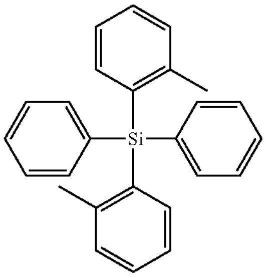
Formula (31)
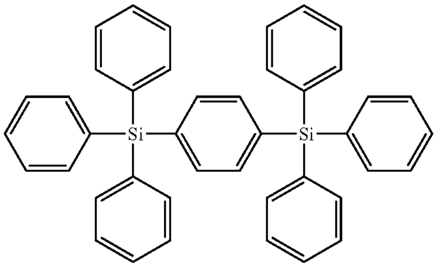
Formula (32)
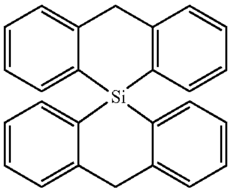
Formula (33)
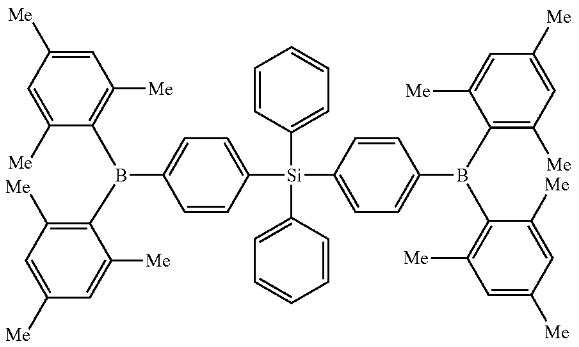

-continued

Formula (34)

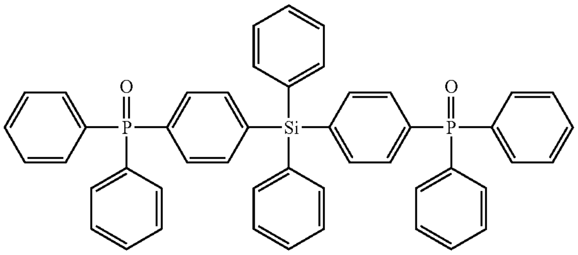

Formula (35)

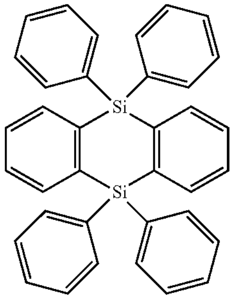

A particularly preferred matrix for phosphorescent dopants may be the compound of formula (36) (EP 652273 B1)

Formula (36)

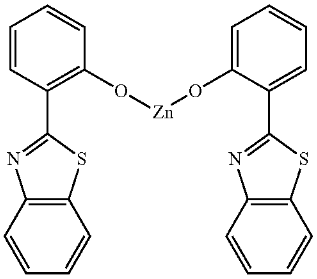

Further particularly preferred matrix materials for phosphorescent dopants may be chosen from compounds of the general formula (37) (EP 1923448A1).

$[M(L)_2]_n$ Formula (37)

wherein M, L, and n are defined as in the reference. Preferably M is Zn, and L is quinolinate, and n is 2, 3 or 4. Very particularly preferred are $[Znq_2]_2$, $[Znq_2]_3$, and $[Znq_2]_4$.

Preference may be given to co-hosts chosen from metal oxinoid complexes whereby lithium quinolate (Liq) or $Alq_3$ may particularly be preferred.

In a preferred embodiment, the matrix material is a SM molecule comprising an emitter group as described above and bellow.

In another preferred embodiment, the matrix material is a conjugated polymer comprising an emitter group as a repeating unit as described bellow.

In yet another preferred embodiment, the matrix material is a non-conjugated polymer comprising an emitter group as a repeating unit as described below.

The compositions according to embodiments may include one or more organic functional materials chosen from hole injection materials (HIM). A HIM refers to a material or unit capable of facilitating holes (i.e. positive charges) injected from an anode into an organic layer or an anode. Typically, a HIM has a HOMO level comparable to or higher than the work function of the anode, i.e. −5.3 eV or higher.

The compositions, according to embodiments may include one or more organic functional materials chosen from hole transport materials (HTM). A HTM is characterized in that it is a material or unit capable of transporting holes (i.e. positive charges) injected from a hole injecting material or an anode. A HTM has usually high HOMO, typically higher than −5.4 eV. In many cases, HIM can also function as a HTM, depending on the adjacent layer.

The compositions according to embodiments may include one or more organic functional materials chosen from hole blocking materials (HBM). A HBM refers to a material which, if deposited adjacent to an emissive layer or a hole transporting layer in a multilayer structure, prevents the holes flowing through. Usually it has a lower HOMO as compared to the HOMO level of the HTM in the adjacent layer. Hole-blocking layers are frequently inserted between the light-emitting layer and the electron-transport layer in OLEDs.

The compositions according to embodiments may include one or more organic functional materials chosen from electron injection materials (EIM). An EIM refers to a material capable of facilitating electrons (i.e. negative charges) injected from cathode into an organic layer. The EIM usually has a LUMO level comparable to or lower than the working function of cathode. Typically, the EIM has a LUMO lower than −2.6 eV.

The compositions according to embodiments may include one or more organic functional materials chosen from electron transport materials (ETM). An ETM refers to a material capable of transporting electrons (i.e. negative charges) injected from an EIM or a cathode. The ETM has usually a low LUMO, typically lower than −2.7 eV. In many cases, an EIM can serve as ETM as well, depending on the adjacent layer.

The compositions according to embodiments may include one or more organic functional materials chosen from electron blocking materials (EBM). An EBM refers to a material which, if deposited adjacent to an emissive or electron transporting layer in a multilayer structure, prevents the electron flowing through. Usually it has a higher LUMO as compared to the LUMO of the ETM in the adjacent layer.

The compositions according to embodiments may include one or more organic functional materials chosen from exciton blocking materials (ExBM). An ExBM refers to a material which, if deposited adjacent to an emissive layer in a multilayer structure, prevents the excitons diffuse through. ExBM should have either a higher triplet level or singlet level as compared to the emissive layer or other adjacent layer.

Further to HIMs mentioned elsewhere herein, suitable HIMs are phenylenediamine derivatives (U.S. Pat. No. 3,615,404), arylamine derivatives (U.S. Pat. No. 3,567,450), amino-substituted chalcone derivatives (U.S. Pat. No. 3,526, 501), styrylanthracene derivatives (JP Showa 54 (1979) 110837), hydrazone derivatives (U.S. Pat. No. 3,717,462), acylhydrazones, stilbene derivatives (JP Showa 61 (1986) 210363), silazane derivatives (U.S. Pat. No. 4,950,950), polysilane compounds (JP Heisei 2 (1990) 204996), PVK and other electrically conductive macromolecules, aniline-based copolymers (JP Heisei 2 (1990) 282263), electrically conductive, macromolecular thiophene oligomers (JP Heisei 1 (1989) 211399), PEDOT:PSS (spin-coated polymer), plasma-deposited fluorocarbon polymers (U.S. Pat. No. 6,127,004, U.S. Pat. No. 6,208,075, U.S. Pat. No. 6,208, 077), porphyrin compounds (JP Showa 63 (1988) 2956965, U.S. Pat. No. 4,720,432), aromatic tertiary amines and styrylamines (U.S. Pat. No. 4,127,412), triphenylamines of the benzidine type, triphenylamines of the styrylamine type, and triphenylamines of the diamine type. Arylamine dendrimers can also be used (JP Heisei 8 (1996) 193191), as can phthalocyanine derivatives, naphthalocyanine derivatives, or butadiene derivatives, are also suitable.

The HIM may be chosen from monomeric organic compound including amine, triarylamine, thiophene, carbazole, phthalocyanine, porphyrine and their derivatives.

Particular preference may be given to the tertiary aromatic amines (US 2008/0102311 A1), for example N,N'-diphenyl-N,N'-di(3-tolyl)benzidine (=4,4'-bis[N-3-methylphenyl]-N-phenylamino)biphenyl) (NPD) (U.S. Pat. No. 5,061,569), N,N'-bis(N,N'-diphenyl-4-aminophenyl)-N,N-diphenyl-4,4'-diamino-1,1'-biphenyl (TPD 232) and 4,4',4"-tris[N,-(3-methylphenyl)-N-phenylamino]triphenylamine (MTDATA) (JP Heisei 4 (1992) 308688) or phthalocyanine derivatives (for example $H_2Pc$, CuPc, CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O-GaPc).

Particular preference may be given to the following triarylamine compounds of the formulae (38) (TPD 232), 2, 3, and 4, which may also be substituted, and further compounds as disclosed in U.S. Pat. No. 7,399,537 B2, US 2006/0061265 A1, EP 1661888 A1, and JP 08292586A.

Further compounds suitable as hole injection material are disclosed in EP 0891121 A1 and EP 1029909 A1. Hole injection layers in general are described in US 2004/0174116.

Formula (38)

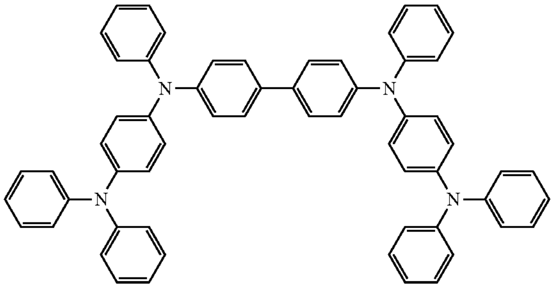

Formula (39)

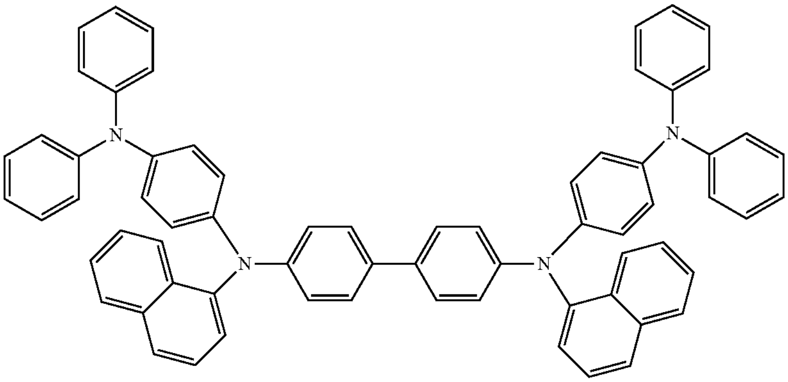

Formula (40)

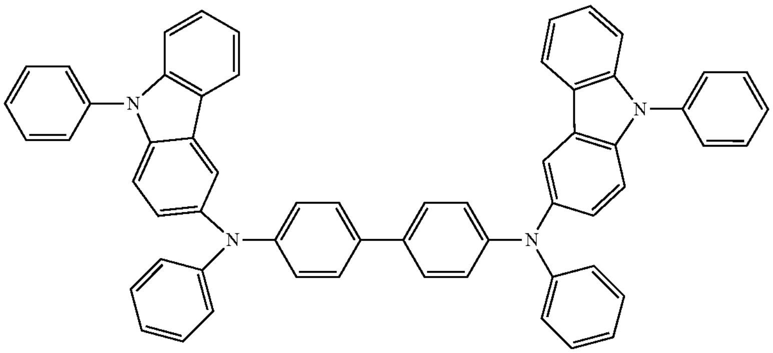

-continued

Formula (41)

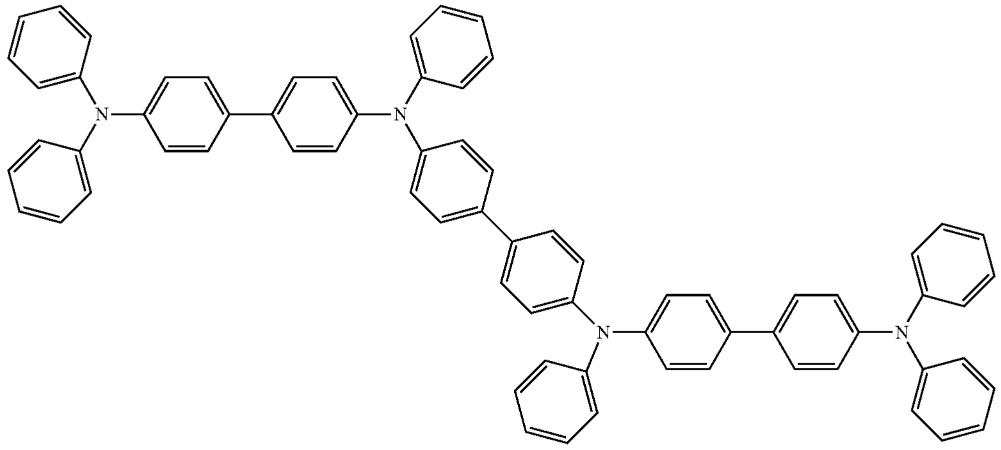

In principle any HTM known to one skilled in the art can be employed in compositions according to embodiments described herein. Further to HTM mentioned elsewhere herein, HTM may be chosen from amines, triarylamines, thiophenes, carbazoles, phthalocyanines, porphyrines, isomers and derivatives thereof. HTM may be particularly chosen from amines, triarylamines, thiophenes, carbazoles, phthalocyanines, and porphyrines.

Suitable materials for hole-transporting layers are phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP A 56-46234), polycyclic aromatic compounds (EP 1009041), polyarylalkane derivatives (U.S. Pat. No. 3,615,402), fluorenone derivatives (JP A 54-110837), hydrazone derivatives (U.S. Pat. No. 3,717, 462), stilbene derivatives (JP A 61-210363), silazane derivatives (U.S. Pat. No. 4,950,950), polysilanes (JP A 2-204996), aniline copolymers (JP A 2-282263), thiophene oligomers, polythiophenes, PVK, polypyrroles, polyanilines and further copolymers, porphyrin compounds (JP A 63-2956965), aromatic dimethylidene-type compounds, carbazole compounds, such as, for example, CDBP, CBP, mCP, aromatic tertiary amine and styrylamine compounds (U.S. Pat. No. 4,127,412), and monomeric triarylamines (U.S. Pat. No. 3,180,730). Even more triarylamino groups may also be present in the molecule.

Preference may be given to aromatic tertiary amines containing at least two tertiary amine units (U.S. Pat. No. 4,720,432 and U.S. Pat. No. 5,061,569), such as, for example, 4,4'-bis[N-(1-naphthyl)-N-phenylamino]biphenyl (NPD) (U.S. Pat. No. 5,061,569) or MTDATA (JP A 4-308688), N,N,N',N'-tetra(4-biphenyl)diaminobiphenylene (TBDB), 1,1-bis(4-di-p-tolylaminophenyl)cyclohexane (TAPC), 1,1-bis(4-di-p-tolylaminophenyl)-3-phenylpropane (TAPPP), 1,4-bis[2-[4-[N,N-di(p-tolyl)amino]phenyl]vinyl] benzene (BDTAPVB), N,N,N',N'-tetra-p-tolyl-4,4'-diaminobiphenyl (TTB), TPD, N,N,N',N'-tetraphenyl-4,4"'-diamino-1,1':4"': 4",1"'-quaterphenyl, likewise tertiary amines containing carbazole units, such as, for example, 4 (9H-carbazol-9-yl)-N,N-bis[4-(9H-carbazol-9-yl)phenyl]benzeneamine (TCTA). Preference may be likewise given to hexaazatriphenylene compounds in accordance with US 2007/0092755 A1.

Particular preference may be given to the following triarylamine compounds of the formulae (42) to (47), which may also be substituted, and as disclosed in EP 1162193 A1, EP 650955 A1, Synth. Metals 1997, 91(1-3), 209, DE 19646119 A1, WO 2006/122630 A1, EP 1860097 A1, EP 1834945 A1, JP 08053397 A, U.S. Pat. No. 6,251,531 B1, and WO 2009/041635.

Formula (42)

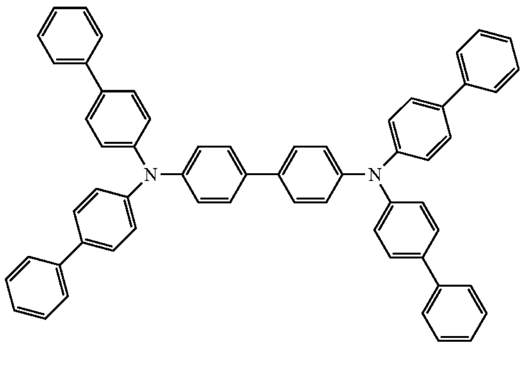

Formula (43)

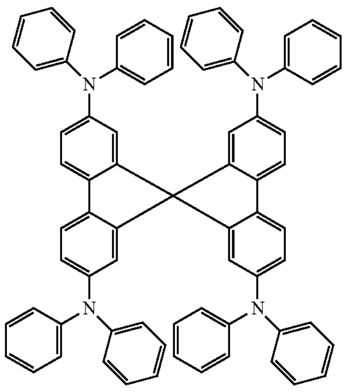

-continued

Formula (44)

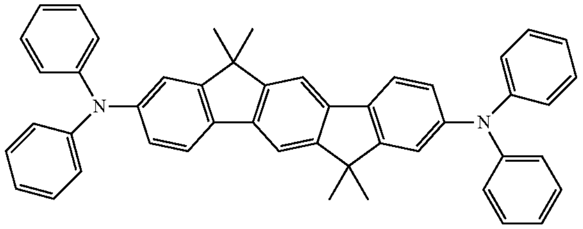

Formula (45)

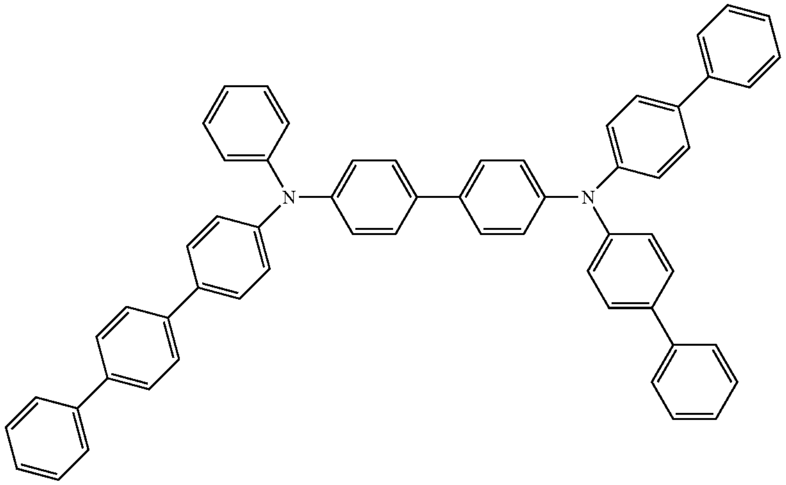

Formula (46)

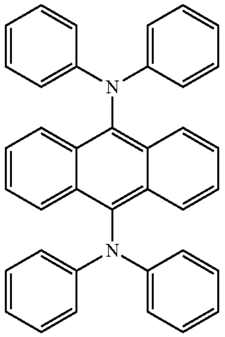

Formula (47)

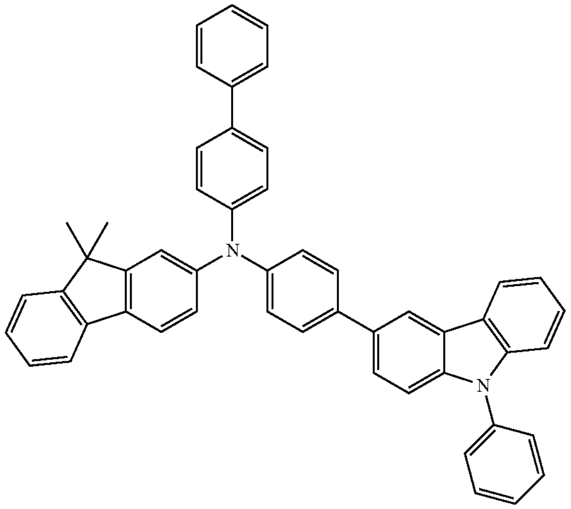

In principle, any HBM known to one skilled in the art can be employed in compositions according to embodiments. Further to HBM mentioned elsewhere herein, suitable hole-blocking materials are metal complexes (US 2003/0068528), such as, for example, bis(2-methyl-8-quinolinolato)(4-phenylphenolato)-aluminium(III) (BAlQ). Fac-tris (1-phenylpyrazolato-N,C2)iridium(III) (Ir(ppz)$_3$) is likewise used for this purpose (US 2003/0175553 A1). Phenanthroline derivatives, such as, for example, BCP, or phthalimides, such as, for example, TMPP, are likewise employed.

Further, suitable hole-blocking materials are described in WO 00/70655 A2, WO 01/41512 and WO 01/93642 A1.

In principle any EIM known to one skilled in the art can be employed in compositions according to embodiments. Further to EIM mentioned elsewhere herein, EIMs, which include at least one organic compound chosen from metal complexes of 8-hydroxyquinoline, heterocyclic organic compounds, fluorenones, fluorenylidene methane, perylenetetracarboxylic acid, anthraquinone dimethanes, diphenoquinones, anthrones, anthraquinonediethylene-diamines, isomers and derivates thereof can be used according to embodiments.

Metal complexes of 8 hydroxyquinoline, such as, for example, Alq$_3$ and Gaq$_3$, can be used as EIM for electron-injection layers. A reducing doping with alkali metals or alkaline-earth metals, such as, for example, Li, Cs, Ca or Mg, at the interface to the cathode is advantageous. Preference may be given to combinations which include Cs, for example Cs and Na, Cs and K, Cs and Rb or Cs, Na and K.

Heterocyclic organic compounds, such as, for example, 1,10-phenanthroline derivatives, benzimidazoles, thiopyran dioxides, oxazoles, triazoles, imidazoles or oxadiazoles, are likewise suitable. Examples of suitable five-membered rings containing nitrogen are oxazoles, thiazoles, oxadiazoles, thiadiazoles, triazoles, and compounds which are disclosed in US 2008/0102311 A1.

Preferred EIMs may be chosen from compounds with the formulae (48) to (50), which may be substituted or unsubstituted.

Formula (48)

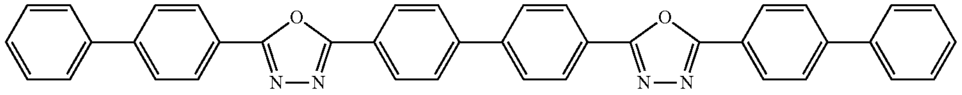

Formula (49)

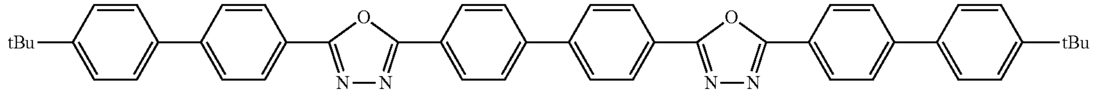

Formula (50)

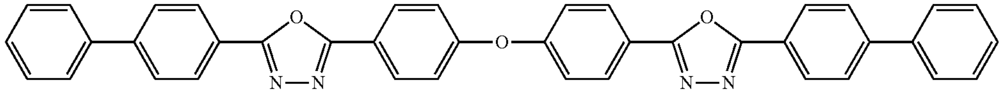

Organic compounds, such as fluorenones, fluorenylidene methane, perylenetetracarboxylic acid, anthraquinone dimethanes, diphenoquinones, anthrones and anthraquinonediethylenediamines, can also be employed, for example Formula (51)

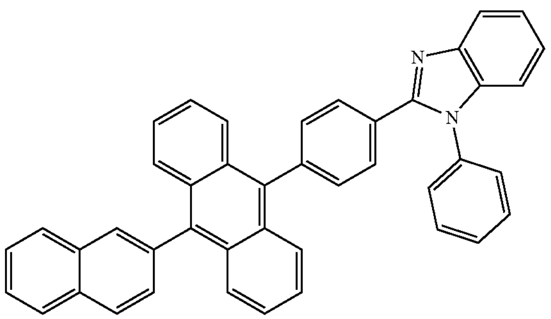

Formula (52)

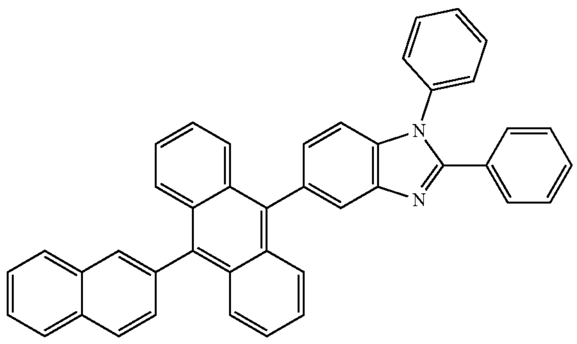

In principle, any ETM known to one skilled in the art can be employed in compositions according to embodiments described herein. Further to ETM mentioned elsewhere herein, a suitable ETM may be chosen from the group consisting of imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, triarylboranes, isomers and derivatives thereof.

Suitable ETMs for electron-transporting layers are metal chelates of 8 hydroxyquinoline (for example Liq, $Alq_3$, $Gaq_3$, $Mgq_2$, $Znq_2$, $Inq_3$, $Zrc_{14}$), Balq, 4 azaphenanthrene-5-ol/Be complexes (U.S. Pat. No. 5,529,853 A; e.g. formula (53)), butadiene derivatives (U.S. Pat. No. 4,356,429), heterocyclic optical brighteners (U.S. Pat. No. 4,539,507), benzazoles, such as, for example, 1,3,5-tris(2-N-phenylbenzimidazolyl)benzene (TPBI) (U.S. Pat. No. 5,766,779, formula (54)), 1,3,5-triazines, pyrenes, anthracenes, tetracenes, fluorenes, spirobifluorenes, dendrimers, tetracenes, for example rubrene derivatives, 1,10-phenanthroline derivatives (JP 2003/115387, JP 2004/311184, JP 2001/267080, WO 2002/043449), silacyl-cyclopentadiene derivatives (EP 1480280, EP 1478032, EP 1469533), pyridine derivatives (JP 2004/200162 Kodak), phenanthrolines, for example BCP and Bphen, also a number of phenanthrolines bonded via biphenyl or other aromatic groups (US 2007/0252517 A1) or phenanthrolines bonded to anthracene (US 2007/0122656 A1, e.g. formulae (55) and (56)), 1,3,4-oxadiazoles, for example formula (57), triazoles, for example formula (58), triarylboranes, for example also with Si (e.g. formula (48)), benzimidazole derivatives and other N heterocyclic compounds (cf. US 2007/0273272 A1), silacyclopentadiene derivatives, borane derivatives, Ga oxinoid complexes.

Preference may be given to 2,9,10-substituted anthracenes (with 1- or 2-naphthyl and 4- or 3-biphenyl) or molecules which contain two anthracene units (US 2008/0193796 A1).

Formula (53)

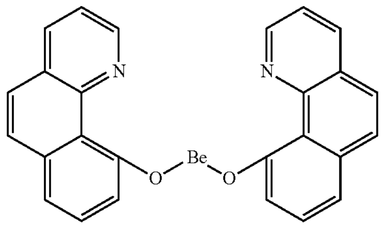

-continued
Formula (54)
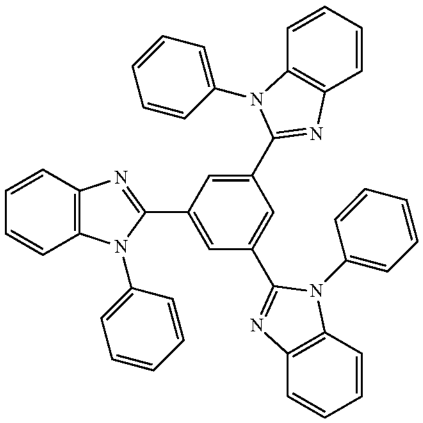
Formula (55)
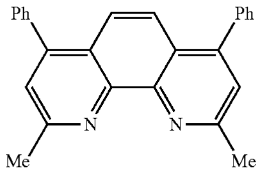
Formula (56)
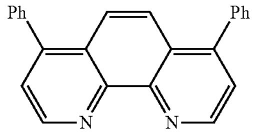
Formula (57)
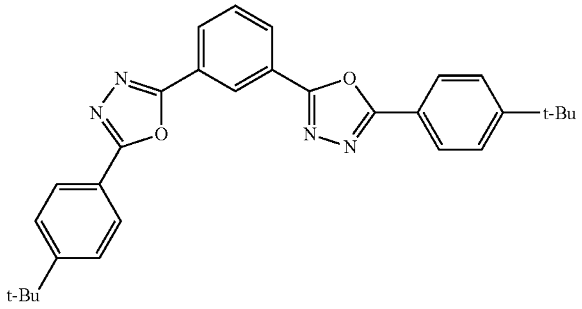
Formula (58)
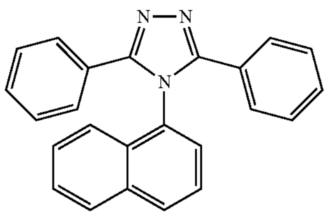
Preference may be likewise given to anthracene-benzimidazole derivatives, such as, for example, the compounds of formulae (59) to (61), and as disclosed in, e.g., U.S. Pat. No. 6,878,469 B2, US 2006/147747 A, and EP 1551206 A1.
Formula (59)
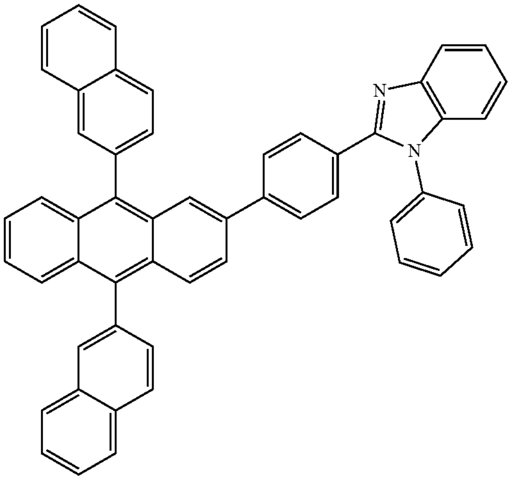
Formula (60)
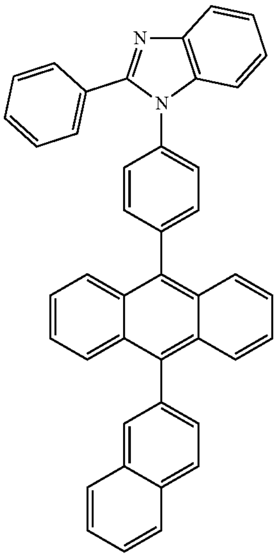
Formula (61)
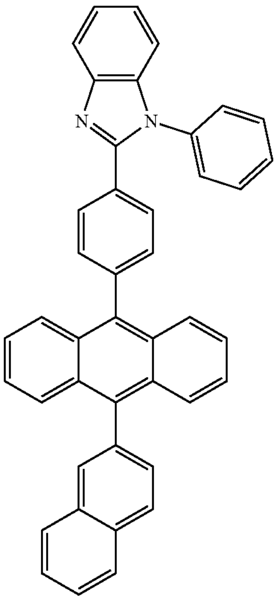

In principle any EBM known to one skilled in the art can be employed in compositions according to embodiments. Further to EBM mentioned elsewhere herein, transition-metal complexes, such as, for example, $Ir(ppz)_3$ (US 2003/0175553) can be employed as materials for an electron-blocking layer.

The EBM may be further chosen from amines, triarylamines and their derivatives.

It is known to a person skilled in the art that the selection of ExBMs suitable for compositions according to embodiments described herein depends on the energy gap of the adjacent layer. Suitable ExBMs are supposed to have a bigger energy gap, either singlet or triplet levels or both than the functional material in the adjacent layer which is optionally an emissive layer. Further to ExBMs mentioned elsewhere herein, substituted triarylamines, such as, for example, MTDATA or 4,4',4"-tris(N,N-diphenylamino)triphenylamine (TDATA), can be used as ExBM for electron-blocking layers. Substituted triarylamines are described, for example, in US 2007/0134514 A1. N-substituted carbazole compounds, such as, for example, TCTA, or heterocycles, such as, for example, BCP, are also suitable.

Metal complexes, such as, for example, $Ir(ppz)_3$ or $Alq_3$, can likewise be used for this purpose.

Compositions according to embodiments described herein may also include a functional material, which may be chosen from small molecules, polymers, e.g. conjugated polymers or non-conjugated side-chain polymers or non-conjugated backbone polymers, oligomers, dendrimers, and blends thereof. The functional polymer may be characterized in that different functions may be incorporated into one large molecule or a blend of large molecules. The functions are, inter alia, the ones of a hole injection material, hole transport material, electron blocking material, emissive material, hole blocking material, electron injection material, electron transport material, and dye. The functions which are incorporated into a polymer can be categorized into different groups. By choosing the desired functional groups and the ratio between them, the polymer can be tuned to have the desired function (s).

The difference between polymers, oligomers and dendrimers is due to the size, size distribution, and branching of the molecular entities as defined above.

Different structures are, inter alia, those as disclosed and extensively listed in WO 2002/077060 A1 and in DE 10337346 A1. The structural units may originate, for example, from the following groups:

Group 1: units which increase the hole-injection and/or transport properties of the polymers; it corresponds to the HIMs or HTMs as described above.

Group 2: units which increase the electron-injection and/or transport properties of the polymers; it corresponds to the EIMs or ETMs as described above.

Group 3: units which have combinations of individual units from group 1 and group 2;

Group 4: units which modify the emission characteristics to such an extent that electrophosphorescence may be obtained instead of electrofluorescence; typically, it corresponds to the phosphorescent emitter, or more preferably emissive metal complexes as described above.

Group 5: units which improve the transition from the so called singlet state to higher spin states, e.g. to a triplet state;

Group 6: units which influence the morphology and/or emission colour of the resultant polymers;

Group 7: units which are typically used as backbone and which may have electron transport function, hole transport function or both.

Preferably, the said organic functional material may be a hole transport or injection polymer including units of groups 1, which may be chosen from units including the low molecular weight HTMs or HIMs as described above.

Further preferred units from group 1 are, for example, triarylamine, benzidine, tetraaryl-para-phenylenediamine, carbazole, azulene, thiophene, pyrrole and furan derivatives and further O, S or N containing heterocycles with a high HOMO. These arylamines and heterocycles preferably result in an HOMO in the polymer of greater than 5.8 eV (against vacuum level), particularly preferably greater than 5.5 eV. Preferred polymeric HTM or HIM may be a polymer including at least one of following repeating unit according to formula (62).

Formula (62)

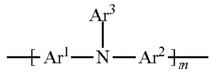

wherein $Ar^1$ which may be the same or different, denote, independently if in different repeating units, a single bond or an optionally substituted mononuclear or polynuclear aryl group, $Ar^2$ which may be the same or different, denote, independently if in different repeating units, an optionally substituted mononuclear or polynuclear aryl group, $Ar^3$ which may be the same or different, denote, independently if in different repeating units, an optionally substituted mononuclear or polynuclear aryl group, m is 1, 2 or 3.

Particularly preferred units of Formula (62) may be chosen from the group consisting of the formulae (63) to (65):

Formula (63)

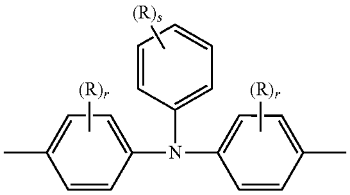

Formula (64)

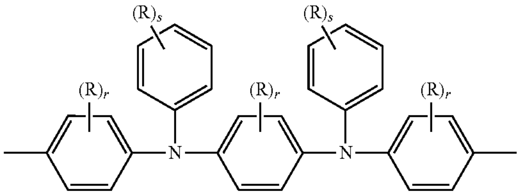

Formula (65)

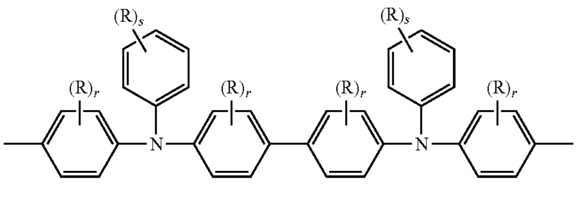

wherein

R, which may be the same or different in each occurrence, may be chosen from H, substituted or unsubstituted aromatic or heteroaromatic group, alkyl, cycloalkyl, alkoxy, aralkyl, aryloxy, arylthio, alkoxycarbonyl, silyl, carboxy group, a halogen atom, cyano group, nitro group or hydroxy group, r is 0, 1, 2, 3 or 4, and s 0, 1, 2, 3, 4 or 5.

Further preferred polymeric HTM or HIM may be a polymer including at least one of following repeating unit according to Formula (66).

$$-(T)_c-(Ar^4)_d-(T^2)_e-(Ar^5)_f- \quad \text{Formula (66)}$$

wherein $T^1$ and $T^2$ are independently of each other chosen from thiophene, selenophene, thieno[2,3b]thiophene, thieno[3,2b]thiophene, dithienothiophene, pyrrole, aniline, all of which are optionally substituted with $R^5$, $R^5$ is in each occurrence independently of each other chosen from halogen, —CN, —NC, —NCO, —NCS, —OCN, SCN, $C(=O)NR^0R^{00}$, —C(=O)X, $—C(=O)R^0$, $—NH_2$, $—NR^0R^{00}$, SH, $SR^0$, $—SO_3H$, $—SO_2R^0$, —OH, $—NO_2$, $—CF_3$, $—SF_5$, optionally substituted silyl, or carbyl or hydrocarbyl with 1 to 40 C atoms that is optionally substituted and optionally contains one or more hetero atoms, $Ar^4$ and $Ar^5$ are independently of each other mononuclear or polynuclear aryl or heteroaryl, which is optionally substituted and optionally fused to the 2,3-positions of one or both of the adjacent thiophene or selenophene groups, c and e are independently of each other 0, 1, 2, 3 or 4, with $1<c+e\leq 6$, d and f are independently of each other 0, 1, 2, 3 or 4.

Examples for polymeric HTMs are as disclosed in WO 2007131582 A1 and WO 20081009343A1.

Preferably, the said organic functional material may be an electron transport or injection polymer including groups 2, which may be preferably chosen from groups including the low molecular weight ETMs or EIMs as described above.

Further preferred units from group 2, which have electron-injection or electron-transport properties, are, for example, pyridine, pyrimidine, pyridazine, pyrazine, oxadiazole, quinoline, quinoxaline and phenazine derivatives, but also triarylboranes and further O, S or N containing heterocycles having a low LUMO. These units in the polymer preferably result in an LUMO of less than 2.7 eV (against vacuum level), particularly preferably less than 2.8 eV.

Preferably, the said organic functional material may be a polymer including units from group 3 in which structures which increase the hole mobility and the electron mobility (i.e. units from groups 1 and 2) are bonded directly to one another. Some of these units may serve as emitters and shift the emission colour into the green, yellow or red. Their use is thus suitable, for example, for the production of other emission colours or a broad-band emission from originally blue-emitting polymers.

Preferably, the said organic functional material may be a polymer including units of group 4, which is preferably chosen from the groups including phosphorescent emitter, particularly emissive metal complexes as described above. Particular preference may be given here to corresponding structural units which contain elements from groups 8 to 10 (Ru, Os, Rh, Ir, Pd, Pt).

Preferably, the said organic functional material may be a polymeric triple matrix including units of group 5, which can improve the transition from the singlet state to the triplet state and which, employed in support of the structural elements from group 4, improve the phosphorescence properties of these structural elements. Suitable for this purpose are, in particular, carbazole and bridged carbazole dimer units, as described in DE 10304819 A1 and DE 10328627 A1. Also suitable for this purpose are ketones, phosphine oxides, sulfoxides, sulfones, silane derivatives and similar compounds, as described in DE 10349033 A1. Further preferred structure units can be chosen from groups including the low molecular weight phosphorescent matrices as described above.

Preferably, the said organic functional materials may be chosen from a polymer including units of group 6, which influence the morphology and/or emission colour of the polymers, or may be, besides those mentioned above, those which have at least one further aromatic or another conjugated structure which do not fall under the above-mentioned groups, i.e. which have only little effect on the charge-carrier mobilities, which are not organometallic complexes or which have no influence on the singlet-triplet transition. Structural elements of this type may influence the morphology and/or emission colour of the resultant polymers. Depending on the unit, they can therefore also be employed as emitters. Preference may be given here, in the case of fluorescent OLEDs, to aromatic structures having 6 to 40 C atoms or also tolan, stilbene or bisstyrylarylene derivatives, each of which may be substituted by one or more radicals R1. Particular preference may be given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4' bi 1,1'-naphthylylene, 4,4'-tolanylene, 4,4'-stilbenzylene or 4,4"-bisstyrylarylene derivatives.

Preferably, the said organic functional material may be a polymer including units of group 7 which contain aromatic structures having 6 to 40 C atoms which are typically used as polymer backbone. These are, for example, 4,5-dihydropyrene derivatives, 4,5,9,10-tetrahydropyrene derivatives, fluorene derivatives as disclosed for example in U.S. Pat. No. 5,962,631, WO 2006/052457 A2 and WO 2006/118345A1, 9,9'-spirobifluorene derivatives as disclosed for example in WO 2003/020790 A1, 9,10-phenanthrene derivatives as disclosed, for example, in WO 2005/104264 A1, 9,10-dihydrophenanthrene derivatives as disclosed for example in WO 2005/014689 A2,5,7-dihydrodibenzooxepine derivatives and cis- and trans-indenofluorene derivatives as disclosed for example in WO 2004041901 A1, WO 2004113412 A2 and binaphthylene derivatives as disclosed for example in WO 2006/063852 A1, and further units as disclosed for example in WO 2005/056633A1, EP 1344788A1 and WO 2007/043495A1, WO 2005/033174 A1, WO 2003/099901A1 and DE 102006003710.3.

Further preferred structural elements from group 7 may be chosen from fluorene derivatives, as disclosed for example in U.S. Pat. No. 5,962,631, WO 2006/052457 A2 and WO 2006/118345 A1, spiro-bifluorene derivatives as disclosed for example in WO 2003/020790 A1, benzofluorene, dibenzofluorene, benzothiophene, dibenzofluorene and their derivatives as disclosed for example in WO 2005/056633A1, EP 1344788A1 and WO 2007/043495A1

Very preferred structural elements of group 7 may be those of formula (67):

Formula (67)

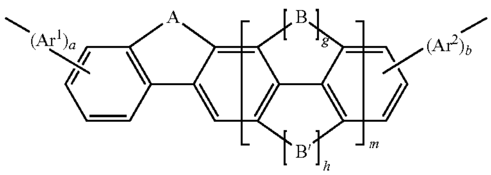

wherein

A, B and B' are independently of each other, and in case of multiple occurrence independently of one another, a divalent group, preferably chosen from $—CR^1R^2—$, $—NR^1—$, $—PR^1—$, —O—, —S—, —SO—, $—SO_2—$, —CO—, —CS—, —CSe—, $—P(=O)R^1—$, $—P(=S)R^1—$ and $—SiR^1R^2—$, $R^1$ and $R^2$ are independently of each other identical or different groups chosen from H, halogen, —CN, —NC, —NCO, —NCS, —OCN, —SCN, $—C(=O)NR^0R^{00}$, —C(=O)X, $—C(=O)R^0$, $—NH_2$, $—NR^0R^{00}$, —SH, $—SR^0$, $—SO_3H$, $—SO_2R^0$, —OH, $—NO_2$, $—CF_3$, $—SF_5$, optionally substituted silyl, or carbyl or hydrocarbyl with 1 to 40 C atoms that is optionally substituted and optionally includes one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally including one or more hetero atoms, each g is independently 0 or 1 and each corresponding h in the same subunit is the other of 0 or 1, m is an integer≥1

$Ar^1$ and $Ar^2$ are independently of each other mono- or polynuclear aryl or heterorary1 that is optionally substituted and optionally fused to the 7,8-positions or 8,9-positions of the indenofluorene group, a and b are independently of each other 0 or 1.

If the groups $R^1$ and $R^2$ form a spiro group with the fluorene group to which they are attached, it is preferably spirobifluorene.

The groups of formula (67) may be preferably chosen from the following formulae (68) to (72):

Formula (68)

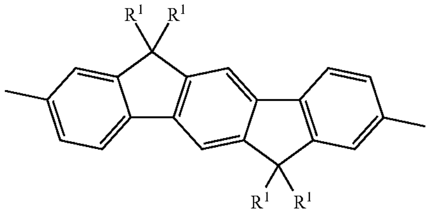

Formula (69)

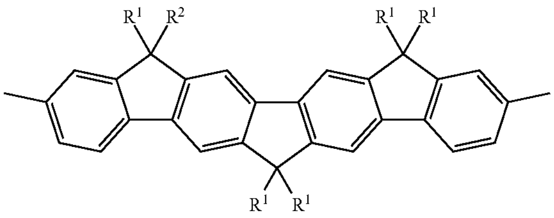

-continued

Formula (70)

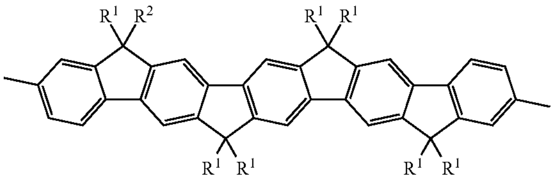

Formula (71)

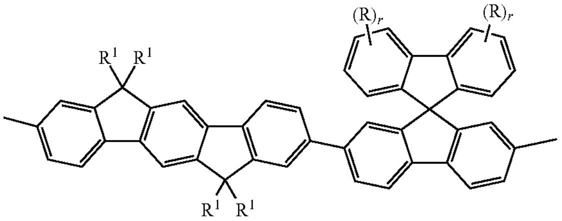

Formula (72)

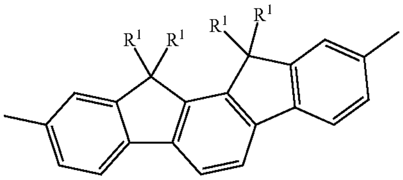

wherein $R^1$ is as defined in formula (67), r is 0, 1, 2, 3 or 4, and R has one of the meanings of $R^1$.

R is preferably F, Cl, Br, I, —CN, $—NO_2$, —NCO, —NCS, —OCN, —SCN, $—C(=O)NR^0R^{00}$, $—C(=O)X^0$, $—C(=O)R^0$, $—NR^0R^{00}$, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, and wherein $R^0$, $R^{00}$ and $X^0$ are as defined above.

Particularly preferred groups of formula (67) may be chosen from the following formulae (73) to (76):

Formula (73)

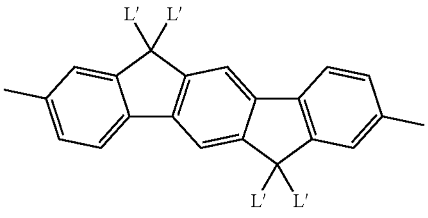

Formula (74)

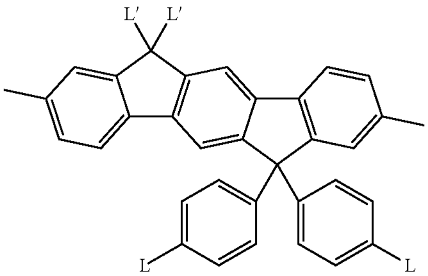

-continued

Formula (75)

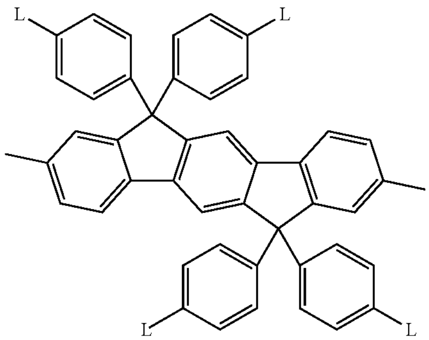

Formula (76)

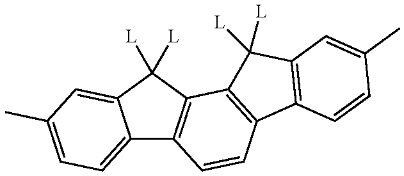

wherein

L may be chosen from H, halogen or optionally fluorinated, linear or branched alkyl or alkoxy with 1 to 12 C atoms, and may preferably be H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

Preference may be given to polymers suitable for use in embodiments, which simultaneously include one or more units chosen from groups 1 to 7. It may likewise be preferred for more than one structural unit from a group to be present simultaneously.

Preference may be given to polymers suitable for use in embodiments which, besides structural units of an emitter, also include at least one structural unit from the above-mentioned groups. At least two structural units are particularly preferably from different classes of those mentioned above.

The proportion of the different classes of groups, if present in the polymer, may be preferably in each case at least 5 mol %, particularly preferably in each case at least 10 mol %. In particular, one of these structural units may be chosen from the group of hole-conducting units and the other group may be an emitting unit, where these two functions (hole conduction and emission) may also be taken on by the same unit.

However, a smaller proportion of the emitting units, in particular green- and red-emitting units, may also be preferred, for example for the synthesis of white-emitting copolymers. The way in which white-emitting copolymers can be synthesised is described in detail in DE 10343606 A1.

In order to ensure adequate solubility, it may be preferred for on average at least 2 non-aromatic C atoms to be present in the substituents per recurring unit. Preference may be given here to at least 4 and particularly preferably at least 8 C atoms. In addition, individual C atoms of these may be replaced by O or S. However, it may be entirely possible for this to mean that a certain proportion of recurring units does not carry any further non-aromatic substituents.

In order to avoid impairing the morphology of the film, it may be preferred to have no long-chain substituents having more than 12 C atoms in a linear chain, particularly preferably none having more than 8 C atoms and in particular none having more than 6 C atoms.

The polymer used as organic functional material in embodiments may be chosen from statistical or random copolymers, alternating or regioregular copolymers, block copolymers or combinations thereof.

The composition according to present invention comprises an organic emitter which can be in a form chosen from a small molecule and a non-conjugated polymer Preferably the composition according to the present invention comprises an organic emitter which is a non-conjugated polymer.

Particularly preferably, the composition according to present invention comprises a non-conjugated polymer, which includes at least one triplet emitter as repeating unit.

In a further preferred embodiment, the organic emitter is a non-conjugated side-chain polymer, which comprises at least one emitter unit and yet preferably at least further functional unit selected from Host, HIM, HTM, EIM, ETM and Emitter as described above. The non-conjugated polymers are especially important for phosphorescent OLEDs based on polymer, because they have high triplet level. In general, such phosphorescent polymer may be obtained by means of radical copolymerization of vinyl compounds, and includes at least one phosphorescent emitter and at least one charge transport unit on side chain, as disclosed in U.S. Pat. No. 7,250,226 B2. Further examples for such phosphorescent polymer are disclosed for example in JP 2007/211243 A2, JP 2007/197574 A2, U.S. Pat. No. 7,250,226B2, JP 2007/059939A.

In a further embodiment, the said polymer may be a non-conjugated main-chain polymer, also referred to herein as non-conjugated backbone polymer, where the backbone units are connected by spacers on a main-chain. Like non-conjugated side-chain polymers, non-conjugated main-chain polymers give also a high triplet level. The backbone unit can be selected from host materials, matrix materials, and members f group 5 and group 7 as described above. An example for triplet OLEDs based on non-conjugated main-chain polymers is disclosed in DE 102009023154.4.

Very preferably, the non-conjugated or partially-conjugated polymer comprises a non-conjugated backbone unit.

The preferred non-conjugated backbone unit is selected from a unit comprising indenofluorene derivatives, as for example in the following formulae as disclosed in DE 102009023156.0.

Formula (77)

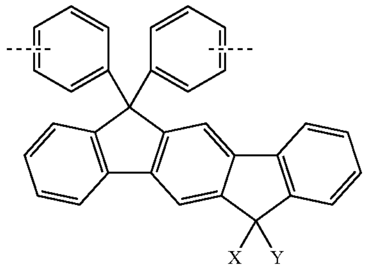

-continued

Formula (78)

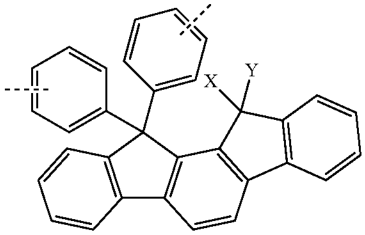

wherein X and Y are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

Further preferred non-conjugated backbone unit is selected from a unit comprising fluorene, phenanthrene, dehydrophenanthrene, indenofluorene derivatives, as for example in the following formulae as disclosed in DE 102009023154.

Formula (79)

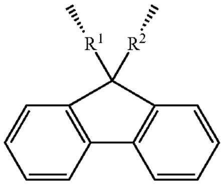

Formula (80)

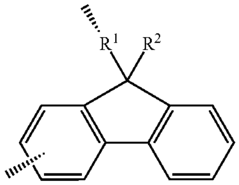

Formula (81)

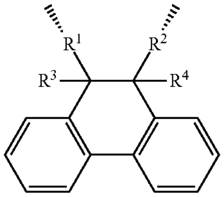

Formula (82)

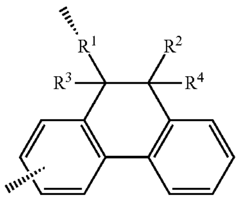

Formula (83)

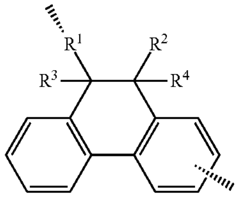

-continued

Formula (84)

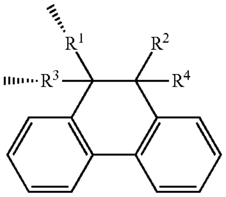

Formula (85)

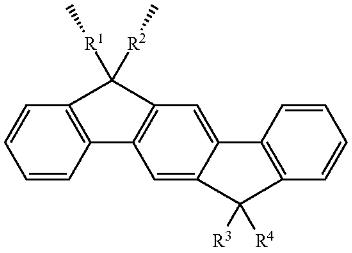

Formula (86)

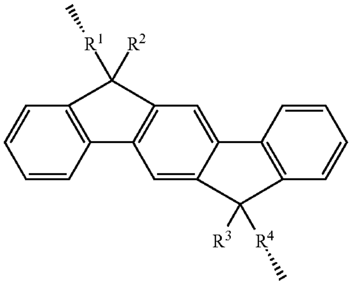

Formula (87)

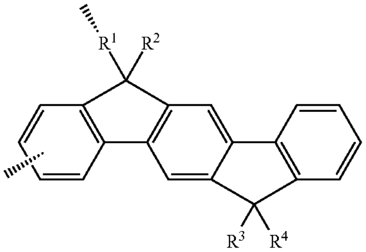

Formula (88)

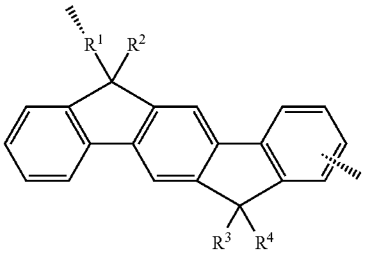

Formula (89)

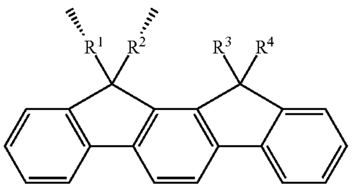

-continued

Formula (90)

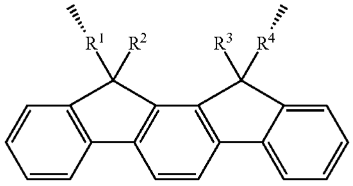

Formula (91)

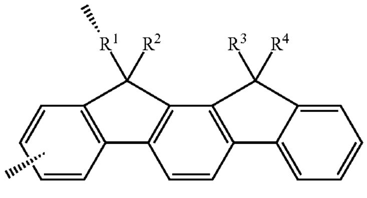

Formula (92)

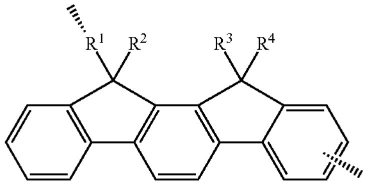

wherein $R^1$ to $R^4$ are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

The part of the structural units building the polymer backbone in a non-conjugated hole-transporting or dominated hole transporting polymer, which is used in an emissive layer, is typically in the range between 10 and 99 mol %, preferably between 20 and 80 mol %, and particularly preferably between 30 and 60 mol %.

In a further embodiment, the said polymer can also be a non-conjugated polymer for fluorescent OLEDs. Preferred singlet non-conjugated polymers are, for example, side-chain polymers with antracenenes, benzanthrecenes and their derivates in the side-chain, as disclosed in JP 2005/108556, JP 2005/285661, JP 2003/338375 etc. Further preferably, the fluorescent polymer is a non-conjugated backbone polymer as described as above.

Preferred semiconducting materials, which can be incoporated into quantum dot, are selected from elements of Group II-VI, such as CdSe, CdS, CdTe, ZnSe, ZnS, ZnTe, HgS, HgSe, HgTe and alloys thereof such as CdZnSe; Group III-V, such as InAs, InP, GaAs, GaP, InN, GaN, InSb, GaSb, AlP, AlAs, AlSb and alloys such as InAsP, CdSeTe, ZnCdSe, InGaAs; Group IV-VI, such as PbSe, PbTe and PbS and alloys thereof; Group III-VI, such as InSe, InTe, InS, GaSe and alloys such as InGaSe, InSeS; Group IV semiconductors, such as Si and Ge alloys thereof, and combinations thereof in composite structures and core/shell structures. In some embodiments, the QD of the invention comprises semiconducting materials selected from Group II-VI semiconductors, alloys thereof and core/shell structures made there from. In further embodiments, the Group II-VI semiconductors are CdSe, CdS, CdTe, ZnSe, ZnS, ZnTe, alloys thereof, combinations thereof and core/shell, core multishell layered-structures thereof.

According to embodiments of the composition described herein, the emission wavelength of at least one of the one or more quantum dots may be longer than the emission wavelength of the organic emitter. In a variation of these embodiments, the absorption spectrum of at least one of the one or more quantum dots overlaps with the emission spectrum of the organic emitter. Hence, a combination of QDs and the organic emitter results in a desired emission.

According to a further embodiment, the at least one quantum dot has at least one absorption intensity maximum at a wavelength in a range of 450 to 800 nm, and/or the organic emitter has at least one emission intensity maximum at a wavelength in a range of 450 to 800 nm. Therefore, a hybrid OLED using a mixture of a QD and the organic emitter results in emission of light predominantly in the part of the spectrum visible for human eye.

In some embodiments, the organic emitter has at least one emission intensity maximum in the blue wavelength range and the at least one quantum dot has at least one emission intensity maximum in the green and/or red wavelength range. Alternatively or in addition, the organic emitter may have at least one emission intensity maximum in the green wavelength range and the at least one quantum dot has at least one emission intensity maximum in the red wavelength range. Hence, a combination of QDs and the organic emitter results in a desired emission in the visible part of the light spectrum.

In some embodiments, the ratio of the at least one quantum dot and the organic emitter is from 1:2 to 2:1 in volume. This ratio may allow an efficient Förster energy transfer between the organic emitter and the at least one quantum dot. In a preferred embodiment, a pure green or pure red emission is necessary, for example for RGB display. In this case, a complete energy transfer from organic emitter to QD is desired. Alternatively, in another embodiments, the ratio of the at least one quantum dot and the organic emitter is from 0.01:1 to 0.2:1, preferably from 0.015:1 to 0.15:1, and particularly preferably from 0.02:1 to 0.1:1 in volume. This particular ratio allows a partial Förster transfer between the organic emitter and the at least one quantum dot, to get for example white emission.

One possible mechanism of the said energy transfer is resonant energy transfer, i.e. Förster transfer. Further mechanisms for energy transfer between emitter(s) and QD(s) are possible.

According to embodiments, the concentration of the QD(s) in the composition may be selected so that the charge carrier transport properties of the layer comprising the composition is less-influenced, or not influenced. The concentration range of QD(s) in the composition can be chosen from: between 0.01 and 20 wt %, between 0.05 and 10 wt %, and between 0.1 and 5 wt %, referring to the weight of the composition. In further embodiments, the organic emitter may be a small molecule singlet emitter or a triplet emitter. The triplet emitter is preferably a metal complex. Both the small molecule singlet emitter and the triplet emitter can be chosen from emitters mentioned elsewhere herein.

In embodiments, described herein, the triplet emitter can be in a form chosen from a small molecule, a non-conjugated side-chain polymer, a non-conjugated backbone polymer, an oligomer and a dendrimer. These can be chosen from materials mentioned elsewhere herein.

According to embodiments of the composition, the at least one quantum dot is selected from type of semiconductor, including Group II-VI, Group III-V, Group IV-VI and Group IV semiconductors. Suitable semiconductor materials include, but are not limited to, Si, Ge, Sn, Se, Te, B, C (including diamond), P, BN, BP, BAs, AlN, AlP, AlAs, AlS, AlSb, BaS, BaSe, BaTe, CaS, CaSe, CaTe, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2(S, Se, Te)_3$, $Al_2CO$, and an appropriate combination of two or more such semiconductors.

In a particularly preferred embodiment, the QD of the invention comprises semiconducting materials selected from Group II-VI semiconductors, alloys thereof and core/shell structures made there from. In further embodiments, the Group II-VI semiconductors are CdSe, CdS, CdTe, ZnSe, ZnS, ZnTe, alloys thereof, combinations thereof and core/shell, core multi-shell layered-structures thereof.

Further, in embodiments, the composition includes at least one organic functional material being a host material, and/or at least one further organic functional material chosen from HTM, HIM, ETM, EIM and an emitter. These materials can be chosen from HTMs, HIMs, ETMs, EIMs and emitters mentioned elsewhere herein.

In some embodiments, the composition is a mixture of the one or more quantum dots and the at least one organic emitter, which each are soluble in an organic solvent.

Another aspect of the invention relates to a formulation, preferably a solution, comprising a composition as described above and below and one or more organic solvents;

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof. The concentration of the composition in the solution is preferably 0.1 to 10% by weight, more preferably 0.5 to 5% by weight. Optionally, the solution also comprises one or more binders to adjust the rheological properties, as described in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve the composition, although it is desirable to have at least one true solvent in a blend.

Another preferred form of a formulation according to the present invention is an emulsion, and very preferably a mini-emulsion, which are specially formulated heterophase systems in which stable nanodroplets of one phase are dispersed in a second, continuous phase. The present invention relates to a mini-emulsion, wherein the different components of the composition are located either in the same phase or in the different phases. Preferred distributions are as follows:

1) majority or all of QDs in nanodroplets (discontinuous phase), and majority or all of organic emitters and other functional compounds in the continuous phase;
2) majority or all of QDs and organic emitters in nanodroplets, and majority or all of other functional compounds, such as host compound, in the continuous phase;
3) majority or all of QDs, organic emitters and host materials in nanodroplets, and majority or all of other functional compounds, such as co-host material or E™ or HTM, in the continuous phase;

Both mini-emulsion, wherein the continuous phase is a polar phase, and inverse miniemulsion, wherein the continuous phase is a non-polar phase, could be used in the present invention. The preferred form is the mini-emulsion. To increase the kinetic stability of the emulsion, surfactant(s) could be added. The selection of solvents for two phase and surfactants, and the processing to make a stable mini-emulsion is well known to one skilled in the art, or are referred to various publications, for example, Landfester et al. in Annu. Rev. Mater. Res. (06), 36, p 231

For use as thin layers in electronic or opto-electronic devices the composition or a formulation of them of the present invention may be deposited by any suitable method. Liquid coating of devices such as OLEDs is more desirable than vacuum deposition techniques. Solution deposition methods are particularly preferred. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing, slot-die coating. Ink-jet printing is particularly preferred as it allows high resolution displays to be prepared.

Selected solutions of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the composition of the present invention should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing composition of the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point>100° C., more preferably >140° C. Such solvent(s) also enhance film formation in the layer deposited and reduce defects in the layer.

The ink jet fluid (that is mixture of solvent, binder and the composition) preferably has a viscosity at 20° C. of 1-100 mPa·s, more preferably 1-50 mPa·s and most preferably 1-30 mPa·s.

The composition or a formulation of them according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

In another embodiment, the formulation of any other embodiment described herein can be used in the manufacture of an opto-electronic device, preferably an electroluminescent device.

In a further embodiment, an electroluminescent device is provided, including a composition of any embodiment described herein or a formulation of any embodiment described herein. According to a yet further embodiment, the electroluminescent device is a light emitting diode including an anode, a cathode, and an emissive layer, the emissive layer being positioned or sandwiched between the anode and the cathode. The device may, for instance, be a light emitting diode.

The electroluminescent device of embodiments described herein may emit in at least one wavelength range chosen from the blue wavelength range, the green wavelength range, the red wavelength range, and the infrared wavelength range. Further, the electroluminescent device of embodiments described herein may emit white light.

Devices according to embodiments described herein may also include additional layers which were not deposited using a composition of embodiments described herein. The additional layer may be deposited by a technique from solution or by vapour deposition. Hereby the specific method employed depends on the characteristics of the material used and a person skilled in the art has no problem to select the appropriate technique. The material which is deposited can be any material used in the field of electronic and opto-electronic multilayer structures. In particular the material may be any material described herein. Furthermore, the materials used may be chosen from organic and inorganic functional materials as outlined below:

Inorganic compounds, such as p type Si and p type SiC, and inorganic oxides, e.g., vanadium oxide ($VO_X$), molybdenum oxide ($MoO_x$) or nickel oxide ($NiO_x$) can also be used as HIM.

Electron injection layers (EILs) are often constructed from an insulator and semiconductor.

Preferred alcali metal chalcogenides for EILs may be $Li_2O$, LiO, $Na_2S$, $Na_2Se$, NaO, $K_2O$, $Cs_2O$.

Preferred alkaline-earth metal chalcogenides for EILs may be CaO, BaO, SrO, BeO, BaS, CaSe.

Preferred halides of alkali metals for EILs may be LiF, NaF, KF, CsF, LiCl, KCl, NaCl.

Preferred halides of alkaline-earth metals for EILs may be $CaF_2$, $BaF_2$, $SrF_2$, $MgF_2$, $BeF_2$.

It is likewise possible to employ alkali metal complexes, alkaline-earth metal complexes, rare-earth metals (Sc, Y, Ce, Th, Yb), rare-earth metal complexes, rare-earth metal compounds (preferably $YbF_3$, $ScF_3$, $TbF_3$) or the like.

The structure of suitable EILs is described, for example, in U.S. Pat. No. 5,608,287, U.S. Pat. No. 5,776,622, U.S. Pat. No. 5,776,623, U.S. Pat. No. 6,137,223, U.S. Pat. No. 6,140,763, U.S. Pat. No. 6,914,269.

An electron-transport layer may consist of an intrinsic material or may include a dopant. $Alq_3$ (EP 278757 B1) and Liq (EP 0569827 A2) are examples of intrinsic layers. 4,7-diphenyl-1,10-phenanthroline (Bphen):Li 1:1 (US 2003/02309890) and rubrene/LiF are examples of doped layers.

In addition to the materials mentioned above, an electronic device according to embodiments described herein, e.g. an electroluminescent device, may include at least one anode, at least one cathode and one or more substrates.

Preferred materials for the anode may be metal oxides chosen from, but not limited to, indium tin oxide (ITO), indium zinc oxide (IZO), tin oxide (SnO), ZnO, InO, aluminium-zinc-oxide (AlZnO), and other metal oxides such as Al- and In-zinc oxide doped with zinc oxide, magnesium-indium-oxide, and nickel-tungsten-oxide. Metal nitrides such as galliumnitrides and metal selenides such as zinc-selenide and metal-sulfides such as zinc-sulfide can also be used. Further materials that can be used for anodes are electrically conducting polymers, e.g. polythiophenes and polypyrroles.

The anode can be transparent, opaque, or reflective. The anode can also adopt an intermediate state, e.g. both being partially reflective and partially transparent.

If the anode is not or only partially transparent, further conducting materials can be used. Preferred materials for non transparent or partially transparent anodes may be chosen from, Au, Ir, Mo, Pd, Pt, Cu, Ag, Sn, C, Al, V, Fe, Co, Ni, W, and mixtures thereof. The conducting materials can also be mixed with further conducting materials as described above, e.g. InCu.

The anode may be preferably transparent and a particularly preferred material for the anode may be ITO. In the case of a bottom-emitting device, glass or plastic may be coated with ITO. In the case of a top-emitting device, the anode may include a reflecting material. Further materials can be used for anodes, which are known to the person skilled in the art.

A flexible and transparent combination of substrate and anode is described in U.S. Pat. No. 5,844,363 B2 and U.S. Pat. No. 6,602,540 B2, for instance.

The cathode can be transparent, opaque, or reflective. The cathode may be chosen from a metal or an alloy with a low work function. Preferably, metals, alloys, or conducting compounds or materials with a work function of less than 4.0 eV may be used. Particularly preferred cathodes may be chosen from, but not limited to, Ba, Ca, Sr, Yb, Ga, Cd, Si, Ta, Sb, Zn, Mg, Al, In, Li, Na, Cs, Ag, mixtures of two or more elements such as alloys including Mg/Al or Al/Li or Al/Sc/Li or Mg/Ag or metal oxides such as ITO or IZO.

Further preferred materials for cathodes, used to form a thin dielectric layer, may be chosen from a metal which is mixed with LiF, Li2O, $BaF_2$, MgO, or NaF. A typical combination is LiF/Al.

An Mg/Al cathode with ITO layer on top is described in U.S. Pat. No. 5,703,436, U.S. Pat. No. 5,707,745, U.S. Pat. No. 6,548,956 B2, U.S. Pat. No. 6,576,134 B2. An Mg/Ag alloy is described in U.S. Pat. No. 4,885,221.

In embodiments described herein, the substrate may be rigid or flexible. It may be transparent, translucent, opaque or reflective. The materials used can be glass, plastic, ceramic or metal foils, where plastic and metal foils are preferably used for flexible substrates. However, semiconductor materials, such as, for example, silicone wafers or printed circuit board (PCB) materials, can also be employed in order to simplify the generation of conductor tracks. Other substrates can also be employed.

The glass used can be, for example, soda-lime glass, Ba- or Sr-containing glass, lead glass, aluminium silicate glass, borosilicate glass, Ba borosilicate glass or quartz.

Plastic plates can consist, for example, of polycarbonate resin, acrylic resin, vinyl chloride resin, polyethylene terephthalate resin, polyimide resin, polyester resin, epoxy resin, phenolic resin, silicone resin, fluorine resin, polyether sulfide resin or polysulfone resin.

For transparent films, use is made, for example, of polyethylene, ethylene-vinyl acetate copolymers, ethylene-vinyl alcohol copolymers, poly-propylene, polystyrene, polymethyl methacrylate, PVC, polyvinyl alcohol, polyvinylbutyral, nylon, polyether ether ketone, polysulfone, polyether sulfone, tetrafluoroethylene-perfluoroalkyl vinyl ether copolymers, polyvinyl fluoride, tetrafluoroethylene-ethylene copolymers, tetrafluoroethylene-hexafluoropropylene copolymers, polychlorotrifluoroethylene, polyvinyl-idene fluoride, polyester, polycarbonate, polyurethanes, polyimide or polyether imide.

The substrate may be provided with a hydrophobic layer. The substrates are typically transparent. Other materials than those mentioned here can also be used. Suitable materials are known to the person skilled in the art.

Light emitting or electronic devices of embodiments described herein may include the composition of embodiments.

The host material can be any host material known to a skilled person. Preference may be given to host materials which are described elsewhere herein. Particular preference may be given to host materials chosen from anthracenes, benzanthracenes, indenofluorenes, fluorenes, spirobifluorenes, phenanthrenes, dehydrophenanthrenes, thiophenes, triazines, imidazole, ketones, carbazoles, triarylamines, and derivatives thereof.

Preference may be given to electron transport materials chosen from imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, triarylboranes and derivatives thereof.

The ETM can be any ETM known to a skilled person. Preference may be given to ETMs which are described elsewhere herein. Particular preference may be given to ETMs chosen from imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, and triarylboranes.

The HTM can be any HTM known to a skilled person. Preference may be given to HTMs which are described elsewhere herein. Particular preference may be given to HTMs chosen from amines, triarylamines, thiophenes, carbazoles, phthalocyanines, and porphyrines and derivatives thereof.

Preference may be given to emitter materials chosen from fluorescent emitter materials and phosphorescent emitter materials.

The emitter material can be any emitter material known to a skilled person. Particular preference may be given to emitter materials which are described elsewhere herein.

The metal complexes are organo metallic complexes. Any metal complex suitable for the use in opto-electronic devices and known to the one skilled in the art can be employed. Preference may be given to the metal complexes as described elsewhere herein. Particular preference may be given to metal complexes including metals chosen from transition metals, rare earths, lanthanides and actinides. Very particular preference may be given to metal complexes including metals chosen from Ir, Ru, Os, Eu, Au, Pt, Cu, Zn, Mo, W, Rh, Pd, and Ag.

It is usually an advantage to have a plurality of organic functional materials within a device, either in the same layer or in two adjacent layers, forming a heterojunction either in between the layers or a bulk heterojunction in the layer. Such heterojunctions can be classified into 2 classes: type I, in which the LUMO and HOMO levels of one material (material A) lie within the LUMO-HOMO energy gap of the second material (material B), and type II, in which the minimum energy difference between the highest HOMO state and the lowest LUMO state is between levels on different sides of the heterojunction. Electrons tend to occupy the energetically lowest LUMO level, whereas holes tend to occupy the energetically highest HOMO level. Thus, in a type I heterojunction electrons and holes are located on the same side of the junction and in a type II heterojunction both electrons and holes are located on different sides of the junction. However, because in organic functional materials, the exciton binding energy is usually assumed to be 0.5 eV or more, the band offset of type II is necessarily bigger than about 0.5 eV to ensure the efficient excition dissociation at the heterojunction, which is an important issue particularly for organic solar cells.

Preference may be given to an OLED, which is prepared using at least one composition of embodiments described herein.

A typical sequence of layers as found in an OLED is, for example:

optionally a first substrate,
an anode layer,
optionally a hole injection layer (HIL),
optionally a hole transport layer (HTL) and/or an electron blocking layer (EBL),
emissive layer (EML),
optionally an electron transport layer (ETL) and/or a hole blocking layer (HBL),
optionally an electron injection layer (EIL),
a cathode layer,
optionally a second substrate.

The sequence of the above given layer structure is an example. Other sequences are possible.

The composition according to embodiments described herein can be positioned in a layer between any of the layers of a layer structure of an electronic device. Preferably, the composition can be used in an EML of an electroluminescent device.

In another preferred embodiment, the electroluminescent device of embodiments is a soluble system based OLEDs, particularly PLEDs as disclosed for example in WO 2004/084260 A2, which includes a multilayer structure as follows: anode/HIL/EML/cathode.

The HIL may be a transparent conductive polymer thin film including HIM. Preferred HIMs may be those mentioned above.

The emissive materials may further include a blend or mixture of two or more different emitters, for example two emitters of different type and/or emitters that emit light of different colors. Thus, a device of embodiments may provide white light.

In a further embodiment, the present invention relates to the use of the composition in other opto-electronic devices and the opto-electronic devices comprising the same. The preferred other opto-electronic devices is selected from organic plasmon emitting device, organic spintronic device, organic laser, and organic light emitting transistors.

Organic Plasmon emitting device may be preferably referred to the device as reported by Koller et al., in Nature Photonics (2008), 2, 684-687. The OPED is very similar as OLED as described above, except that at least one of anode and cathode should be capable to couple surface Plasmon from the emissive layer. It may be preferred here that an OPED is prepared using compositions or formulations of embodiments described herein and the methods of embodiments described herein.

One preferred organic spintronic device may be a spin-valve device, as reported, e.g., by Z. H. Xiong et al., in Nature 2004, Vol. 427, 821, including two ferromagnetic electrodes and an organic layer between the two ferromagnetic electrodes. The ferromagnetic electrode may be composed of Co, Ni, Fe, or alloys thereof, or $ReMnO_3$ or $CrO_2$, wherein Re is rare earth element. It may be preferred that at least one of the organic layers is coated by a layer including a composition of embodiments described herein.

The structure of a layer including a composition according to embodiments as described herein clearly distinguishes from other layers. The structure of such a layer results in beneficial opto-electronic characteristics of a device including the layer.

Embodiments described herein also relate to devices including a layer obtainable using a composition or a formulation according to embodiments described herein.

According to a further embodiment, a method of generating white light includes applying a light generating potential to a device of any of the embodiments described herein.

The compositions, formulations and devices comprising the compositions and/or formulations can be used for any kind of light sources, which includes, but is not limited to, lightening and display applications. Light sources play also a crucial role in many therapeutic, cosmetic, prophylactic, and diagnostic applications. In some of these applications the function of light sources is solely directed to illuminate a display or the subject to be treated. In other cases the beneficial effect of light is exploited when human or animal subjects are treated. The present invention also relates to said compositions and/or formulations for the treatment, prophylaxis, and/or diagnosis of diseases and/or cosmetic conditions.

This includes any kind of phototherapy, photodynamic therapy, and any combination of light therapy and therapies not using light such as drug therapies, commonly referred herein as to light therapy or light treatment. Light treatments may be directed to outer surfaces of the subject to be treated such as skin, wounds, mucosa, eye, hair, nail, nail beds, and gingival, and tongue, but light treatment can also be applied inside the subject in order to treat, e.g., the lungs, blood vessels, heart, breast, and other organs of the subject.

These diseases and/or conditions include, e.g., skin diseases, and skin-related conditions including skin-ageing, and cellulite, enlarged pores, oily skin, folliculitis, precancerous solar keratosis, skin lesion, wrinkled and sun-damaged skin, crow's feet, skin ulcers (diabetic, pressure, venous stasis), acne rosacea lesions, cellulite; photomodulation of sebaceous oil glands and the surrounding tissues; reducing wrinkles, acne scars and acne bacteria, inflammation, pain, wounds, psychological and neurological related diseases and conditions, edema, Pagets disease, primary and metastatic tumors, connective tissue disease, manipulation of collagen, fibroblast, and fibroblast derived cell levels in mammalian tissue, illuminating retina, neoplastic, neovascular and hypertrophic diseases, inflammation and allergic reactions, perspiration, sweating and hyperhydrosis from eccrine (sweat) or apocrine glands, jaundice, vitiligo, ocular neovascular diseases, bulimia nervosa, herpes, seasonal affective disorders, mood, sleep disorders, skin cancer, crigler naijar, atopic dermatitis, diabetic skin ulcers, pressure ulcers, bladder infections, relief of muscular pains, pain, stiffness of joints, reduction of bacteria, disinfection, disinfection of liquids, disinfection of beverages such as water, disinfection of nutrition, gingivitis, whitening teeth, treatment of teeth and tissue in mouth, wound healing.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the embodiments, are inventive in their own right and not just as part of an embodiment of the present invention. Independent protection may be sought for these features in addition to or alternative to any invention presently claimed.

The teaching as disclosed here can be abstracted and combined with other examples disclosed.

Other features of the invention will become apparent in the course of the following description of exemplary embodiments, which are given for illustration of the invention and are not intended to be limiting thereof.

BRIEF DESCRIPTION OF THE DRAWINGS

The FIGURE: Absorption spectrum of QD1, electroluminescence spectra of OLED1 to OLED4, and photoluminescence spectrum of QD1.

WORKING EXAMPLES

Example 1

Materials

The following materials can be used in the present invention as examples.

EG1: Triplet green emitter.
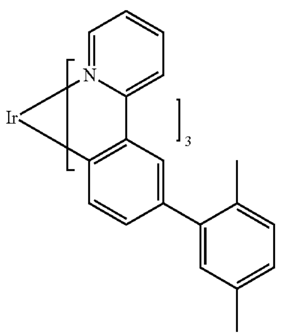
TMM1: Triplet matrix material.
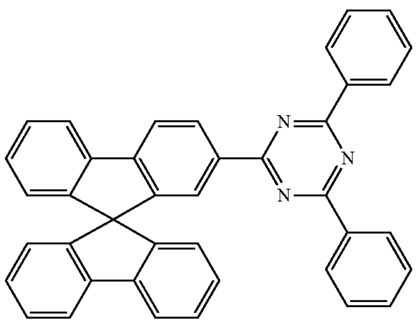
TMM2: Triplet matrix material.
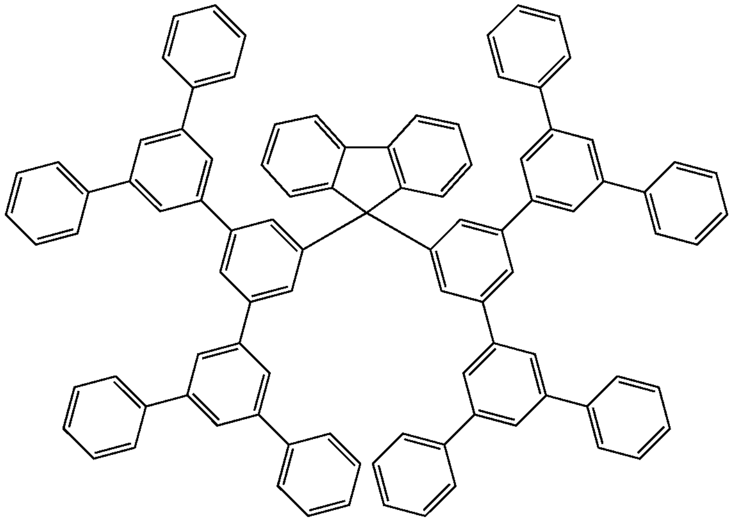
Polymer P1: Emissive triplet polymer.
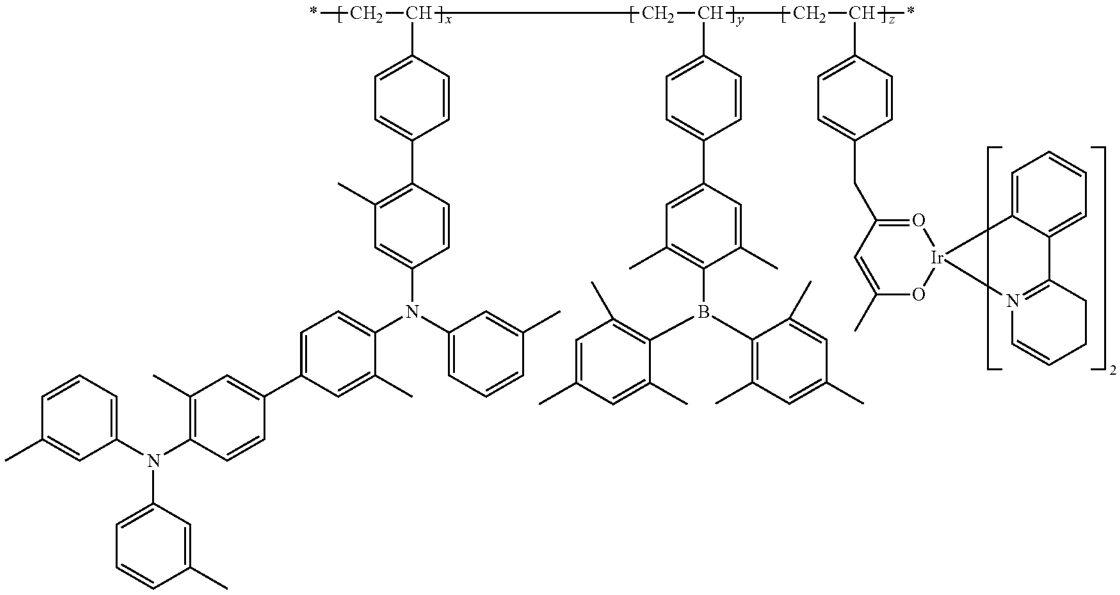
x:y:z (mol %)
= 22:73:5

The polymer P1 can be synthesized by radical polymerization of the corresponding monomers in the given ratio.

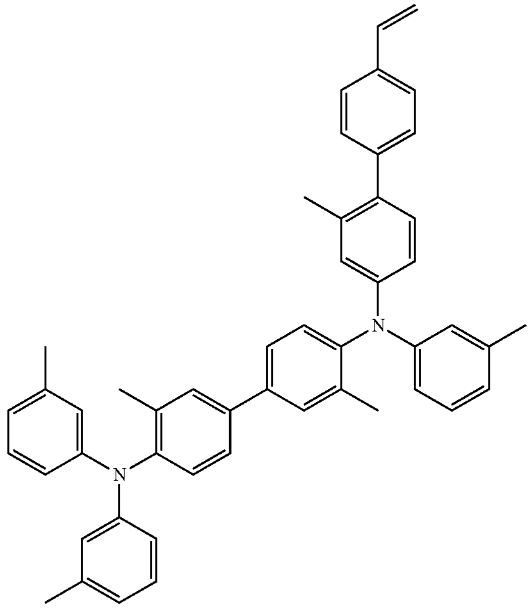

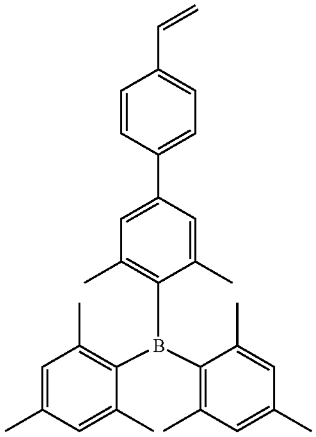

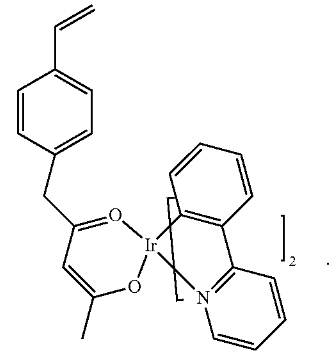

The monomers are dissolved in 200 ml dry toluene and degassed with argon. The reaction is started by adding AlBN as initiator. The reaction mixture is then heated to 75° C. for 16 hours and is stopped by adding 10 ml methanol. The solvent is removed in the vacuum and the residue is dissolved in THF. The polymer is isolated by precipitation in methanol and dry in vacuum.

Polymer P2: Non-conjugated polymeric triplet matrix.

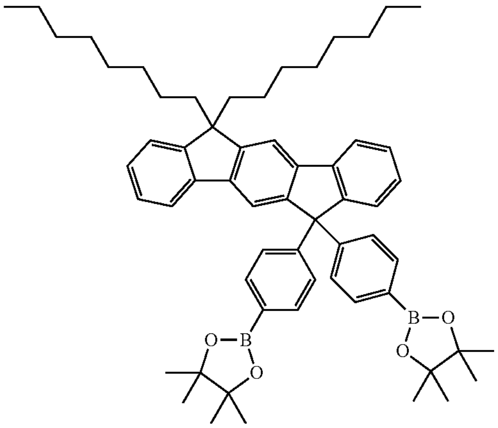

50%

+

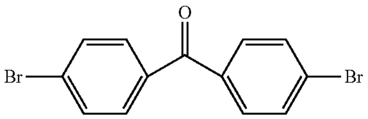

+

25%

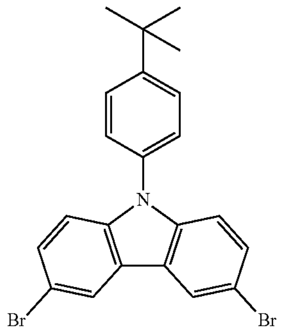

25%

The synthesis of P2 is described in detail in DE 102009023154.4.

SMB1: Matrix for singlet singlet system.

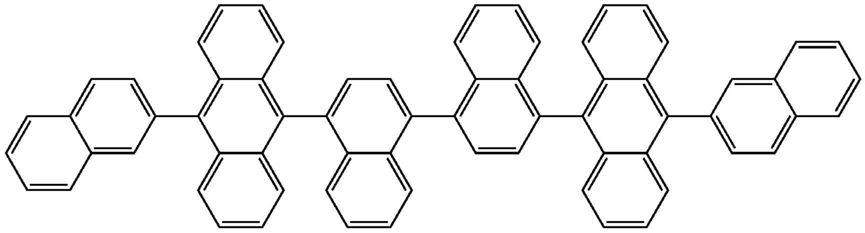

SEB1: Singlet blue emitter SEB1.

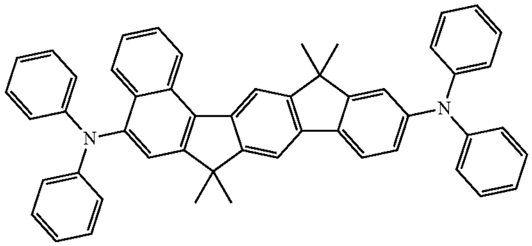

Polymer P3: Non-conjugated side-chain polymer as matrix for singlet emitter.

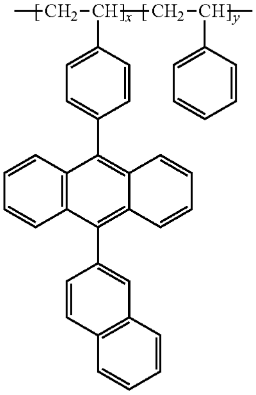

x:y (mol %) = 50:50

The synthesis of polymer P3 is described in detail in DE 102010006377.0. Interlayer polymer P4

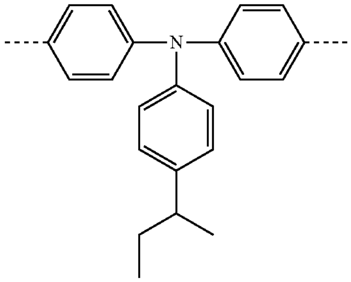

50%

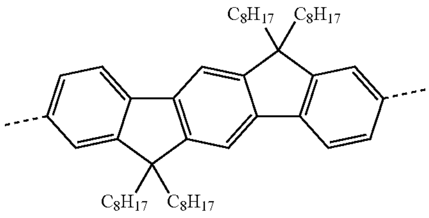

50%

The polymer P4 is synthesized by Suzuki coupling as disclosed in WO 03/048225.

Red quantum dot QD1 is a core-shell type quantum-dot which can be purchased from Plasmachem GmbH, Berlin, Germany. QD1 has a CdSe spherical core capped with epitaxial ZnS shell. QD1 has a hydro-phobic surface layer comprising of mostly trioctylphosphine oxide. The emission maximum of QD1 is 630 nm+/−5 nm. The emission FWHM of QD1 is smaller than 35 nm and its core diameter is approximately 5.4 nm.

Example 2

OLED Preparation from Solution

OLEDs with the layer structure:1. cathode; 2. EML; 3. Interlayer; 4. HIL; 5. ITO) using corresponding solutions shown in Table 1, are prepared according to the following procedure:

1. Deposition of 80 nm PEDOT (Baytron P AI 4083) as HIL onto an ITO coated glass substrate by spin coating;
2. Deposition of 20 nm interlayer by spin coating from toluene solution of P4 having a concentration of 0.5% wt/l in glovebox;
3. Heating interlayer at 180° C. for 1 hour in glovebox;
4. Deposition of the EML from a solution to a desired thickness by using doctor blade technique (dip-coating may also be used here); the materials for EMLs, the corresponding solutions and the thickness of EMLs are listed in Table 1. The different thickness for EML for different colors is mainly due to the cavity effect. The optimal thickness for blue is found to be 65 nm, for green and red the optimal thickness is 80 nm. Spin-coating is not the optimal method to coat EML, because the quantum dots are much heavier than other organic compounds, most of them may be lost by the centrifugal force during the spin-coating;

5. Heating the device to remove residual solvent; the heating conditions are listed in Table 1. The different conditions result from the different glass transition temperatures $T_9$ or different melting points $T_m$ of the EML materials. Heat-treatment shouldn't lead to re-crystallization in EML;
6. Deposition of a Ba/Al cathode (3 nm/150 nm) over the emissive layer by vacuum thermal evaporation;
7. Encapsulation of the device using an UV cured resin.

TABLE 1

EML materials and process parameters

| | Composition for EML [wt %] | Solvent | Conc. [mg/ml] | Heating [min/° C.] | EML thickness [nm] |
|---|---|---|---|---|---|
| OLED1 | 40% TMM1:40% TMM2:20% TEG1 | T | 24 | 10/180 | 80 |
| QD-LED1 | 30% TMM1:30% TMM2:20% TEG1:20% QD1 | T | 24 | 10/180 | 80 |
| OLED2 | P1 | T | 24 | 60/140 | 80 |
| QD-LED2 | 80% P1:20% QD1 | T | 24 | 60/140 | 80 |
| OLED3 | 80% P2:20% TEG1 | T | 12.5 | 10/180 | 80 |
| QD-LED3 | 60% P2:20% TEG1:20% QD1 | T | 12.5 | 10/180 | 80 |
| OLED4 | 95% SMB1:5% SEB1 | C | 16 | 30/120 | 65 |
| QD-LED4 | 90% SMB1:5% SEB1:5% QD1 | C | 16 | 30/120 | 80 |
| OLED5 | 95% P3:5% SEB1 | T | 10 | 10/180 | 65 |
| QD-LED5 | 90% P3:5% SEB1:5% QD1 | T | 10 | 10/180 | 80 |

Solvent: T = toluene; C = chlorbenzene.
Conc. = concentration.
Heating [min/° C.] stands for minutes heating at the temperature in ° C., e.g. 10/180 means 10 minutes heating at 180° C.

The terms OLED1 to OLED5 in Table 1 correspond to reference OLEDs without quantum dots in the emissive layer whereas QD-LED1 to QD-LED5 represent OLEDs according to the present invention having quantum dots in the emissive layer.

Example 3

OLED Characterization

In order to characterize the OLEDs according to the present invention, the following properties are recorded: VIL (voltage-current-luminance) characteristics, EL spectrum and color coordinates, efficiency, driving voltages.

The FIGURE depicts the absorption and photoluminescence (PL) spectrum of QD1 and electroluminescence (EL) spectrum of OLED1 to OLED4. The PL-spectrum of QD1 overlaps with the EL-spectrum of OLED1 to OLED4, whereby the overlap is particularly significant with the EL-spectrum of the blue emitting OLED4. The EL-spectrum of OLED5, which is not shown in the FIGURE, is very similar to the EL-spectrum of OLED4.

Table 2 summarizes the results employing OLED1 as control. Uon stands for turn-on voltage, U(100) for voltage at 100 nits (1 nits=cd/m$^2$), and EQE for external quantum efficiency. The theoretical maximal external quantum efficiency (Max. EQE) for the QD-LED is calculated by PLQE multiplied with Max. EQE of the corresponding OLED.

QD-LED1 to QD-LED5 show the same CIE coordinates in the deep red region. Maximal external quantum efficiencies of more than 1% are achieved with combination of triplet green/yellow and QDs (QD-LED1 to QD-LED3), which represent significant improvements as compared to max. EQEs reported for QDs in light emitting diodes. The combination of triplet OLEDs with quantum dots is, thus, very beneficial.

TABLE 2

| Device | Max. Eff. [cd/A] | Uon [V] | U(100) [V] | CIE @ 100 cd/m$^2$ | Max. EQE | Theoretical Max EQE |
|---|---|---|---|---|---|---|
| OLED1 | 27.0 | 2.6 | 3.7 | 0.33/0.63 | 7.45% | |
| QD-LED1 | 2.2 | 4.0 | 5.8 | 0.67/0.33 | 1.53% | 2.23% |
| OLED2 | 41.5 | 3.6 | 5.9 | 0.48/0.52 | 12.91% | |

TABLE 2-continued

| Device | Max. Eff. [cd/A] | Uon [V] | U(100) [V] | CIE @ 100 cd/m$^2$ | Max. EQE | Theoretical Max EQE |
|---|---|---|---|---|---|---|
| QD-LED2 | 1.9 | 3.9 | 5.6 | 0.67/0.33 | 1.35% | 3.87% |
| OLED3 | 31.2 | 3.3 | 5.8 | 0.34/0.62 | 8.66% | |
| QD-LED3 | 2.5 | 3.5 | 6.0 | 0.67/0.33 | 1.80% | 2.60% |
| OLED4 | 2.0 | 5.5 | 8.7 | 0.14/0.19 | 1.42% | |
| QD-LED4 | 0.5 | 5.7 | 9.3 | 0.67/0.33 | 0.39% | 0.42% |
| OLED5 | 1.0 | 11.5 | 13.9 | 0.14/0.19 | 0.71% | |
| QD-LED5 | 0.3 | 12.1 | 14.2 | 0.67/0.33 | 0.18% | 0.21% |

Further improvement can easily be achieved without being inventive by 1) concentration optimization; 2) using QDs having stronger absorption in green and yellow wavelength ranges; 3) using QDs having high PLQE; 4) using higher efficiency OLEDs; For triplet OLEDs, the max. theoretical EQE can be as high as 20%.

The max. EQEs of QD-LED4 and QD-LED5 are high if the low max. EQEs of the reference devices OLED4 and OLED5 are taken into account., i.e. QD-LED4 and QD-LED5 QD-LED4 and QD-LED5QD-LED4 and QD-LED5 show efficient energy transfer from singlet blue to QD. Employing a singlet blue with an improved performance in OLED4 and/or OLED5, one skilled in the art is able based on the present invention to get, without being inventive, a high performance red QD-LED.

The invention claimed is:

1. An electroluminescent device comprising a light emitting layer consisting of one type of quantum dot and one type of organic emitter, wherein said organic emitter is a phosphorescent, non-conjugated polymeric compound that includes at least one unit comprising a host compound, and a metal complex, the metal selected from a transition, a rare earth, a lanthanide, or an actinide metal, and the concentration of the quantum dots in the composition is in a range from 0.1 to 20 wt %;

wherein the quantum dot is selected from the group consisting of CdSe, CdS, CdTe, ZnSe, ZnS, ZnTe, alloys thereof, combinations thereof, core/shell structures thereof, and core multi-shell layered structures thereof, with a trioctylphosphine oxide coating the surface of the quantum dot;

wherein the one organic emitter is a phosphorescent, non-conjugated polymer that includes a repeat unit selected from formula (77) or (78)

Formula (77)

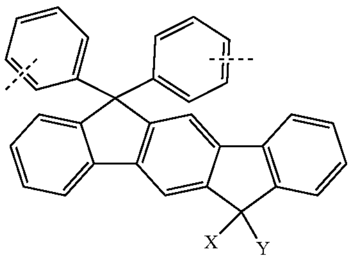

Formula (78)

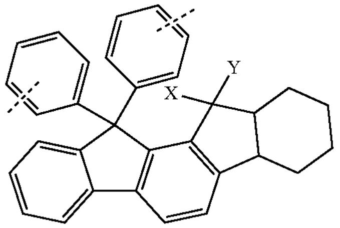

wherein X and Y are independently selected from H, F, an alkyl group with 1 to 40 carbon atoms, an alkenyl group with 2 to 40 carbon atoms, an alkynyl group with 2 to 40 carbon atoms, a substituted or unsubstituted aryl group with 6 to 40 carbon atoms, and a substituted or unsubstituted heteroaryl group, wherein the heteroaryl group has 5 to 25 ring members.

2. The electroluminescent device of claim 1, wherein the metal is selected from the group consisting of Ir, Ru, Os, Eu, Au, Pt, Cu, Zn, Mo, W, Rh, Pd, and Ag.

3. The electroluminescent device of claim 1, wherein the one quantum dot has an emission wavelength that is longer than the emission wavelength of said at least one organic emitter.

4. The electroluminescent device of claim 1 further comprising at least one organic functional material selected from a host material, hole transport material, hole injection material, hole blocking material, electron transport material, electron injection material, electron blocking material, and emitter material, wherein said at least one organic functional material is selected from the group consisting of small molecules, conjugated polymers, non-conjugated polymers, oligomers, and dendrimers.

5. The electroluminescent device of claim 1, wherein said phosphorescent, non-conjugated polymeric compound includes at least one further organic functional group selected from a host material, hole transport material, hole injection material, electron transport material, and electron injection material.

6. The electroluminescent device of claim 1, wherein said electroluminescent device is a light emitting diode comprising an anode, a cathode, and the light emitting layer, wherein the emitting layer is positioned between said anode and said cathode.

7. The electroluminescent device of claim 1, wherein said electroluminescent device emits either white light or emits in at least one wavelength range chosen from the blue wavelength range, the green wavelength range, the red wavelength range, and the infrared wavelength range.

8. The device of claim 1, wherein the non-conjugated polymer further includes a repeat unit selected from the group consisting of formulae (79) to (92)

Formula (79)

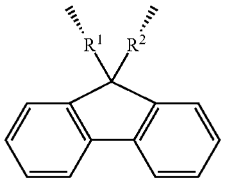

Formule (80)

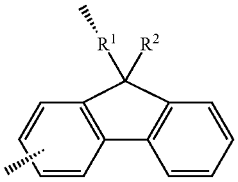

Formula (81)

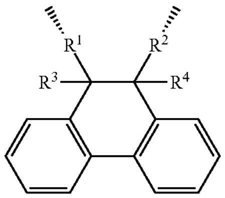

Formula (82)

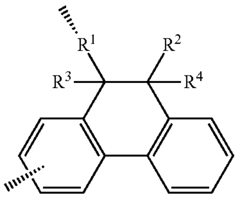

Formula (83)

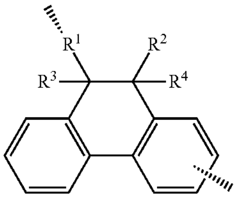

Formula (84)

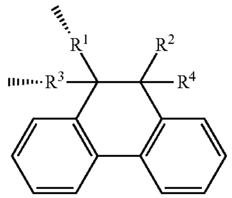

-continued

Formula (85)

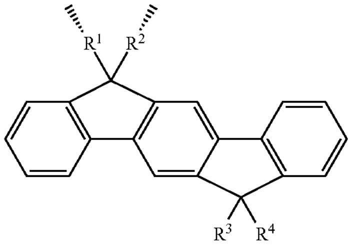

Formula (86)

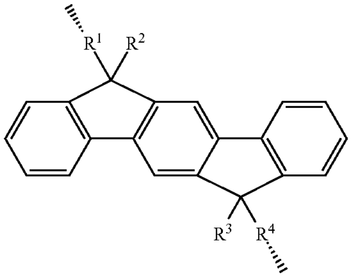

Formula (87)

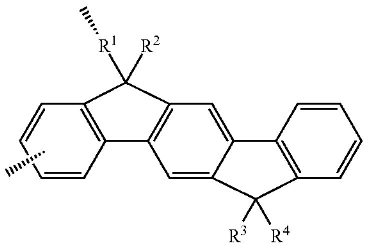

Formula (88)

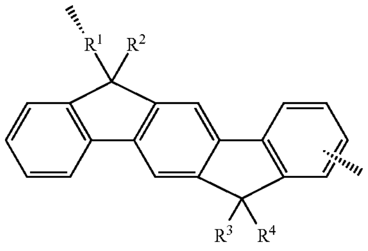

-continued

Formula (89)

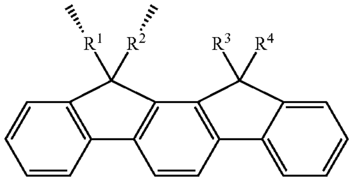

Formula (90)

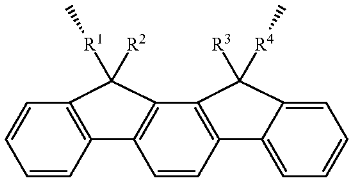

Formula (91)

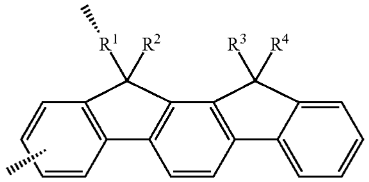

Formula (92)

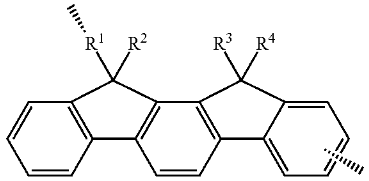

wherein $R^1$ to $R^4$ are independently from each other selected from H, F, an alkyl group with 1 to 40 carbon atoms, an alkenyl group with 2 to 40 carbon atoms, an alkinyl group with 2 to 40 C-atoms, a substituted or unsubstituted aryl group with 6 to 40 carbon atoms, and a substituted or unsubstituted heteroaryl group, wherein the heteroaryl group has 5 to 25 ring members.

* * * * *